US008591279B1

(12) United States Patent
Cok et al.

(10) Patent No.: US 8,591,279 B1
(45) Date of Patent: Nov. 26, 2013

(54) MAKING DISPLAY APPARATUS WITH PIXEL-ALIGNED GROUND MESH

(71) Applicants: Ronald Steven Cok, Rochester, NY (US); Mitchell Stewart Burberry, Webster, NY (US); Kurt Michael Sanger, Rochester, NY (US)

(72) Inventors: Ronald Steven Cok, Rochester, NY (US); Mitchell Stewart Burberry, Webster, NY (US); Kurt Michael Sanger, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/655,523

(22) Filed: Oct. 19, 2012

(51) Int. Cl.
*H01J 9/24* (2006.01)

(52) U.S. Cl.
USPC ............................. 445/24; 345/173; 313/582

(58) Field of Classification Search
USPC ............................................ 445/24; 345/173
See application file for complete search history.

(56) References Cited

U.S. PATENT DOCUMENTS

| 3,223,525 | A | | 12/1965 | Jonker et al. |
| 4,246,613 | A | * | 1/1981 | Choder et al. ................ 348/819 |
| 4,853,791 | A | * | 8/1989 | Ginther, Jr. .................. 348/819 |
| 6,645,444 | B2 | | 11/2003 | Goldstein |
| 6,812,637 | B2 | * | 11/2004 | Cok et al. ..................... 313/503 |
| 8,217,913 | B2 | * | 7/2012 | Hotelling et al. ............. 345/173 |
| 2004/0119397 | A1 | * | 6/2004 | Sakamoto ..................... 313/495 |
| 2006/0057502 | A1 | | 3/2006 | Okada et al. |
| 2010/0026664 | A1 | * | 2/2010 | Geaghan ....................... 345/174 |
| 2010/0302201 | A1 | * | 12/2010 | Ritter et al. ................... 345/174 |
| 2011/0007011 | A1 | * | 1/2011 | Mozdzyn ...................... 345/173 |
| 2011/0099805 | A1 | * | 5/2011 | Lee ................................. 29/846 |
| 2011/0289771 | A1 | * | 12/2011 | Kuriki ............................ 29/829 |
| 2011/0291966 | A1 | * | 12/2011 | Takao et al. .................. 345/173 |
| 2012/0031746 | A1 | * | 2/2012 | Hwang et al. ................ 200/5 A |
| 2012/0162116 | A1 | * | 6/2012 | Philipp ......................... 345/173 |

OTHER PUBLICATIONS

U.S. Appl. No. 13/406,649, filed Feb. 28, 2012, by Ronald S. Cok.

* cited by examiner

*Primary Examiner* — Mary Ellen Bowman
(74) *Attorney, Agent, or Firm* — Raymond L. Owens

(57) ABSTRACT

A method of making display apparatus includes providing a display having an array of pixels and locating a ground mesh in proximity to the display. The ground mesh includes a plurality of electrically connected ground lines located between the pixels, so that electro-magnetic radiation emitted or received by the display is reduced.

19 Claims, 23 Drawing Sheets

MAKING DISPLAY APPARATUS WITH PIXEL-ALIGNED GROUND MESH

CROSS REFERENCE TO RELATED APPLICATIONS

Reference is made to commonly assigned U.S. patent application Ser. No. 13/626,924 filed Sep. 26, 2012, entitled "Making Display Apparatus With Pixel-Aligned Ground Micro-Wire" by Ronald S. Cok and U.S. patent application Ser. No. 13/655,509 filed Oct. 19, 2012, entitled "Display Apparatus With Pixel-Aligned Ground Mesh" by Ronald S. Cok, et al, the disclosures of which are incorporated herein.

FIELD OF THE INVENTION

The present invention relates to suppressing electromagnetic interference in a display-and-touch-screen apparatus using a ground-plane structure.

BACKGROUND OF THE INVENTION

Transparent conductors are widely used in the flat-panel display industry to form electrodes that are used to electrically switch light-emitting or light-transmitting properties of a display pixel, for example, in liquid crystal or organic light-emitting diode displays. Transparent conductive electrodes are also used in touch screens in conjunction with displays. In such applications, the transparency and conductivity of the transparent electrodes are important attributes so that they do not inhibit the visibility of the displays. In general, it is desired that transparent conductors have a high transparency (for example, greater than 90% in the visible spectrum) and a low electrical resistivity (for example, less than 10 ohms/square).

Touch screens with transparent electrodes are widely used with electronic displays, especially for mobile electronic devices. Such devices typically include a touch screen mounted over an electronic display that displays interactive information. Touch screens mounted over a display device are largely transparent so a user can view displayed information through the touch-screen and readily locate a point on the touch-screen to touch and thereby indicate the information relevant to the touch. By physically touching, or nearly touching, the touch screen in a location associated with particular information, a user can indicate an interest, selection, or desired manipulation of the associated particular information. The touch screen detects the touch and then electronically interacts with a processor to indicate the touch and touch location. The processor can then associate the touch and touch location with displayed information to execute a programmed task associated with the information. For example, graphic elements in a computer-driven graphic user interface are selected or manipulated with a touch screen mounted on a display that displays the graphic user interface.

Referring to FIG. 20, a prior-art display and touch-screen apparatus 100 includes a display 110 with a corresponding touch screen 120 mounted with the display 110 so that information displayed on the display 110 is viewed through the touch screen 120. Graphic elements displayed on the display 110 are selected, indicated, or manipulated by touching a corresponding location on the touch screen 120. The touch screen 120 includes a first transparent substrate 122 with first transparent electrodes 130 formed in the x dimension on the first transparent substrate 122 and a second transparent substrate 126 with second transparent electrodes 132 formed in the y-dimension facing the x-dimension first transparent electrodes 130 on the second transparent substrate 126. A dielectric layer 124 is located between the first and second transparent substrates 122, 126 and first and second transparent electrodes 130, 132. Referring also to the plan view of FIG. 21, in this example first pad areas 128 in the first transparent electrodes 130 are located adjacent to second pad areas 129 in the second transparent electrodes 132. (The first and second pad areas 128, 129 are separated into different parallel planes by the dielectric layer 124.) The first and second transparent electrodes 130, 132 have a variable width and extend in orthogonal directions (for example as shown in U.S. Patent Application Publication Nos. 2011/0289771 and 2011/0099805). When a voltage is applied across the first and second transparent electrodes 130, 132, electric fields are formed between the first pad areas 128 of the x-dimension first transparent electrodes 130 and the second pad areas 129 of the y-dimension second transparent electrodes 132.

A display controller 142 (FIG. 20) connected through electrical buss connections 136 controls the display 110 in cooperation with a touch-screen controller 140. The touch-screen controller 140 is connected through electrical buss connections 136 and wires 134 and controls the touch screen 120. The touch-screen controller 140 detects touches on the touch screen 120 by sequentially electrically energizing and testing the x-dimension first and y-dimension second transparent electrodes 130, 132.

Referring to FIG. 22, in another prior-art embodiment, rectangular first and second transparent electrodes 130, 132 are arranged orthogonally on first and second transparent substrates 122, 126 with intervening dielectric layer 124, forming touch screen 120 which, in combination with the display 110 forms the touch screen 120 and display apparatus 100. In this embodiment, first and second pad areas 128, 129 coincide and are formed where the first and second transparent electrodes 130, 132 overlap. The touch screen 120 and display 110 are controlled by touch screen and display controllers 140, 142, respectively, through electrical buss connections 136 and wires 134.

Since touch-screens are largely transparent so as not to inhibit the visibility of the displays over which the touch-screens are located, any electrically conductive materials located in the transparent portion of the touch-screen either employ transparent conductive materials or employ conductive elements that are too small to be readily resolved by the eye of a touch-screen user. Transparent conductive metal oxides are well known in the display and touch-screen industries and have a number of disadvantages, including limited transparency and conductivity and a tendency to crack under mechanical or environmental stress. This is particularly problematic for flexible touch-screen-and-display systems. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass. However, the current-carrying capacity of such electrodes is limited, thereby limiting the amount of power that can be supplied to the pixel elements. Moreover, the substrate materials are limited by the electrode material deposition process (e.g. sputtering). Thicker layers of metal oxides or metals increase conductivity but reduce the transparency of the electrodes.

Various methods of improving the conductivity of transparent conductors are taught in the prior art. For example, U.S. Pat. No. 6,812,637 describes an auxiliary electrode to improve the conductivity of the transparent electrode and enhance the current distribution. Such auxiliary electrodes are typically provided in areas that do not block light emission, e.g., as part of a black-matrix structure.

It is also known in the prior art to form conductive traces using nano-particles including, for example silver. The synthesis of such metallic nano-crystals is known. For example, U.S. Pat. No. 6,645,444 describes a process for forming metal nano-crystals optionally doped or alloyed with other metals. U.S. Patent Application Publication No. 2006/0057502 describes fine wirings made by drying a coated metal dispersion colloid into a metal-suspension film on a substrate, pattern-wise irradiating the metal-suspension film with a laser beam to aggregate metal nano-particles into larger conductive grains, removing non-irradiated metal nano-particles, and forming metallic wiring patterns from the conductive grains. However, such wires are not transparent and thus the number and size of the wires limits the substrate transparency as the overall conductivity of the wires increases.

Touch-screens including very fine patterns of conductive elements, such as metal wires or conductive traces are known. For example, U.S. Patent Application Publication No. 2011/0007011 teaches a capacitive touch screen with a mesh electrode, as does U.S. Patent Application Publication No. 2010/0026664. Referring to FIG. 23, a prior-art x- or y-dimension variable-width first or second transparent electrode 130, 132 includes a micro-pattern 156 of micro-wires 150 arranged in a rectangular grid or mesh. The micro-wires 150 are multiple very thin metal conductive traces or wires formed on the first and second transparent substrates 122, 126 (not shown in FIG. 23) to form the x- or y-dimension first or second transparent electrodes 130, 132. The micro-wires 150 are so narrow that they are not readily visible to a human observer, for example 1 to 10 microns wide. The micro-wires 150 are typically opaque and spaced apart, for example by 50 to 500 microns, so that the first or second transparent electrodes 130, 132 appear to be transparent and the micro-wires 150 are not distinguished by an observer.

It is known that micro-wire electrodes in a touch-screen can visibly interact with pixels in a display and various layout designs are proposed to avoid such visible interaction. Thus, the pattern of micro-wires in a transparent electrode is important for optical as well as electrical reasons.

A variety of layout patterns are known for micro-wires used in transparent electrodes. U.S. Patent Application Publication 2010/0302201, U.S. Patent Application Publication No. 2012/0031746, U.S. Patent Application Publication No. 2012/0162116, and U.S. Patent Application Publication No. 2011/0291966 teach various micro-wire patterns used for electrodes in capacitive touch screens. For example, FIG. 24 illustrates first and second orthogonal transparent electrodes 130, 132 having a micro-pattern 156 of micro-wires 150 arranged in a diamond pattern.

When in operation, electronic circuits such as those used to control arrays of pixels in a flat-screen display or to drive electrodes in a capacitive touch screen emit electromagnetic radiation that interferes with other nearby, electronic devices. For example, the signal lines and transistors that control the behavior of pixels in a flat-screen display emit electromagnetic radiation that can interfere with signals in a nearby touch screen. Likewise, the electrodes that are controlled to sense capacitance in a capacitive touch screen emit electromagnetic radiation that can interfere with signal lines and transistors in a nearby flat-screen display. Since touch screens and display devices are typically laminated together in a thin package, such interference can reduce the signal transmission rate or cause spurious signals in either or both of a laminated touch screen and display device.

There is a need, therefore, for an improved method and structure for reducing electromagnetic interference in a touch-screen-and-display apparatus that does not reduce visibility of the display, is robust in the presence of mechanical stress, and reduces reflections.

SUMMARY OF THE INVENTION

In accordance with the present invention, a method of making display apparatus comprises:
providing a display having an array of pixels;
locating a ground mesh in proximity to the display, the ground mesh including a plurality of electrically connected ground lines located between the pixels, so that electro-magnetic radiation emitted or received by the display is reduced.

The present invention provides a display apparatus with reduced electromagnetic interference that preserves display visibility and provides mechanical flexibility. The display apparatus can also be used in combination with a touch screen to reduce electromagnetic interference in both the touch screen and the display.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein.

The Figures are not drawn to scale since the variation in size of various elements in the Figures is too great to permit depiction to scale.

DETAILED DESCRIPTION OF THE INVENTION

Figure 1:
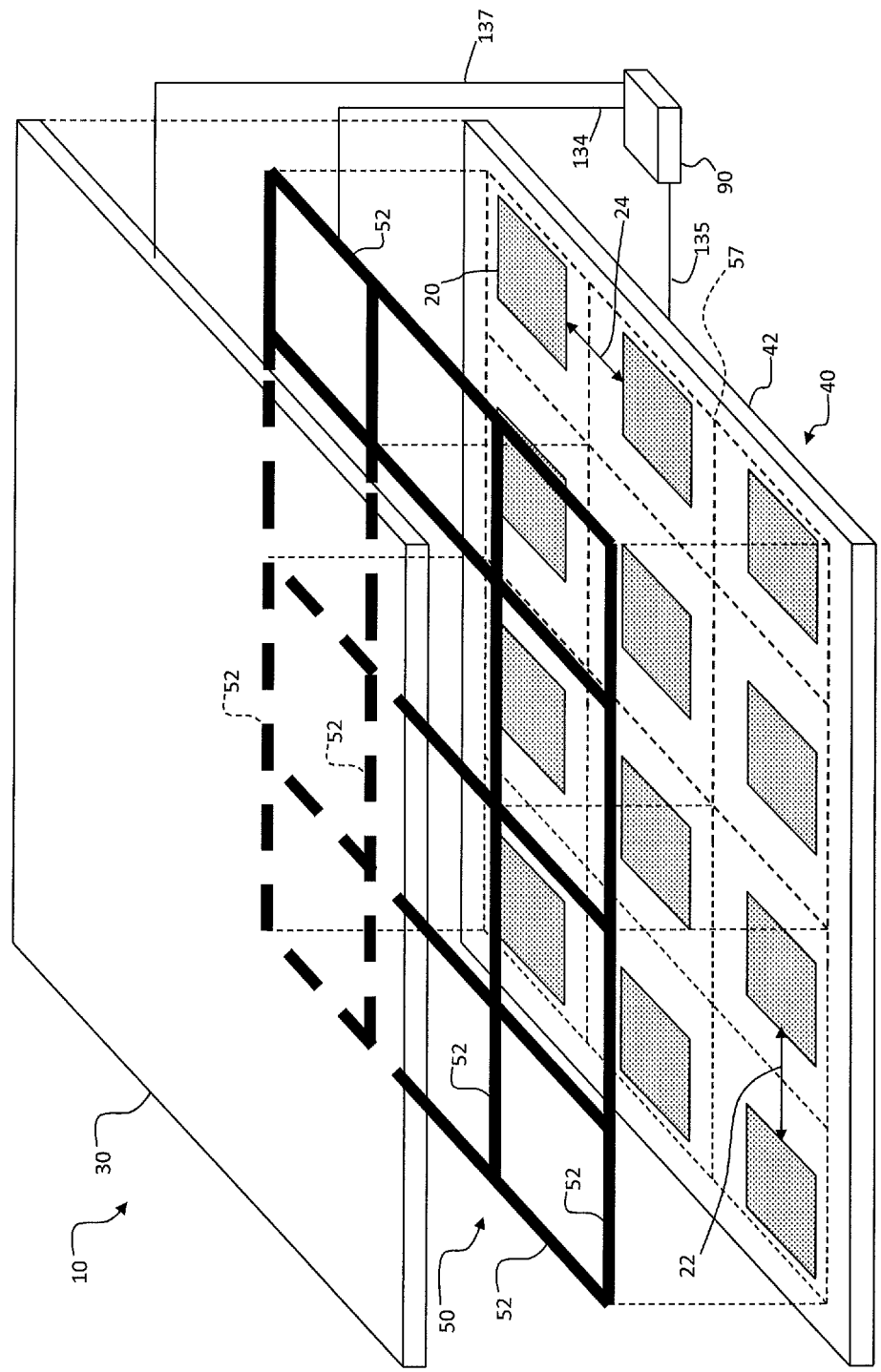
FIG. 1 is an exploded perspective of an embodiment of the present invention.

Referring to FIG. 1 in an embodiment of the present invention, a display apparatus 10 with reduced susceptibility to electro-magnetic interference includes a display 40 having an array of pixels 20. A ground mesh 50 is located in proximity to the display 40. Ground mesh 50 includes a plurality of electrically connected and electrically conducting ground lines 52 located between pixels 20, so that electro-magnetic radiation emitted or received by display 40 is reduced.

Display 40 can be any of various displays 40 known in the art, for example flat-panel displays such as liquid crystal displays or organic light-emitting diode displays. The present invention is particularly useful in portable computing or communication devices having displays 40 incorporating touch screens 30. In a display apparatus 10 including a touch screen 30, ground mesh 50 is located between touch screen 30 and display 40.

Pixels 20 of display 40 can be rectangular or have other shapes and are separated by inter-pixel gaps in at least one dimension, for example rows of pixels 20 can be separated by row inter-pixel gaps 24 or columns of pixels can be separated by column inter-pixel gaps 22, or both. In such an arrangement, ground lines 52 are located in the row inter-pixel gaps 24, the column inter-pixel gaps 22, or both the row inter-pixel gaps 24 and the column inter-pixel gaps 22. Pixels 20 are formed in a layer on or over a display substrate 42. The layer can be planar, for example as is found in rigid displays, or can be flexible.

Ground mesh 50 includes a plurality of electrically interconnected and electrically conducting ground lines 52 formed in a layer separate from the layer in which the pixels 20 are formed, for example ground mesh 50 is above or below the layer in which the pixels 20 are formed. Ground mesh 50 can be formed in a layer or substrate on which touch screen 30 or display 40 is formed. The layer can be planar, rigid, or flexible. Ground lines 52 can be rectangular or can have other shapes. Ground lines 52 can be straight or curved and can accommodate differently shaped pixels 20. Ground mesh 50 can be an interwoven or intertwined structure of electrical conductors (ground lines 52) and can have evenly spaced and uniform openings between ground lines 52 in which are located pixels 20. The ground lines 52 can form a regular structure. Alternatively, ground lines 52 are irregular in shape or distribution.

Ground lines 52 are located between pixels 20 in row or column inter-pixel gaps 24, 22. To be located between pixels 20 means that ground lines 52 projected orthogonally from the layer in which ground lines 52 are formed onto the layer or substrate on which pixels 20 are formed will be located between pixels 20. Projection lines 57 in FIG. 1 illustrate the location of ground lines 52 between pixels 20. Thus, light controlled orthogonally from the layer or substrate on which pixels 20 are formed will pass between ground lines 52 and will not be occluded or otherwise interfered with by ground lines 52 making up ground mesh 50.

A ground line 52 is an electrically conductive wire or trace, for example made of metal, metal oxides, or micro-wires. Ground mesh 50 includes electrically conductive ground lines 52. Ground mesh 50 receives ambient electromagnetic radiation, converting the radiation into electrical current that can be conducted to an apparatus ground signal. Such radiation can be emitted, for example, by electrodes or active electronic components such as transistors found in flat-panel active-matrix displays or by electrodes and conductors found in touch screens. By receiving and absorbing emitted electromagnetic radiation, ground mesh 50 prevents such radiation from being received by conductive elements of display 40 or touch screen 30 and reducing the performance of display 40 or touch screen 30, for example through the production of spurious electronic signals or increased electrical noise. The effect of electromagnetic radiation on electronic equipment such as displays 40 and touch screens 30 are known in the art. Therefore, the use of ground mesh 50 enhances the performance of display apparatus 10, display 40, or touch screen 30.

Ground mesh 50 is located in proximity to display 40. Ground mesh 50 can be formed on or over display 40, on touch screen 30, or on a separate substrate. Ground mesh 50 can be located within a few microns of pixels 20, within 10-100 microns of pixels 20, within 100 microns to 1 mm of pixels 20, or within 1 mm$^{-10}$ mm of pixels 20, depending on the construction of, and the various layers found in, display apparatus 10. It is preferred to locate ground mesh 50 closer rather than farther from pixels 20 in display 40 so as to improve the reception of electromagnetic radiation from display 40 by ground mesh 50. Alternatively, it is preferred to locate ground mesh 50 closer rather than farther from touch screen 30 so as to improve the reception of electromagnetic radiation from touch screen 30 by ground mesh 50. In another embodiment, ground mesh 50 is located close to both display 40 and touch screen 30, for example between display 40 and touch screen 30. As will be readily apparent to knowledgeable designers, it is also useful to locate ground mesh 50 close to pixels 20 of display 40 so that light emitted, transmitted, or reflected by pixels 20 is not occluded by ground lines 52, particularly for a viewer viewing display 40 from a perpendicular angle or an angle close to perpendicular or from within a pre-defined viewing angle.

In an embodiment of the present invention, the ground mesh is located closer to the display 40 than to the touch screen 30. If the frequency at which signals operate in the display 40 is greater than the frequency at which signals operate in the touch screen 30, the display 40 can produce more electro-magnetic interference than is produced by the touch screen 30. By locating the ground mesh 50 closer to the display 40 than to the touch screen 30, interference from the display 40 is preferentially reduced. Alternatively, the ground mesh 50 is located closer to the touch screen 30 than to the display 40, for example if the frequency at which signals operate in the touch screen 30 is greater than the frequency at which signals operate in the display 40, so as to preferentially reduce interference from the touch screen 30.

Figure 23:
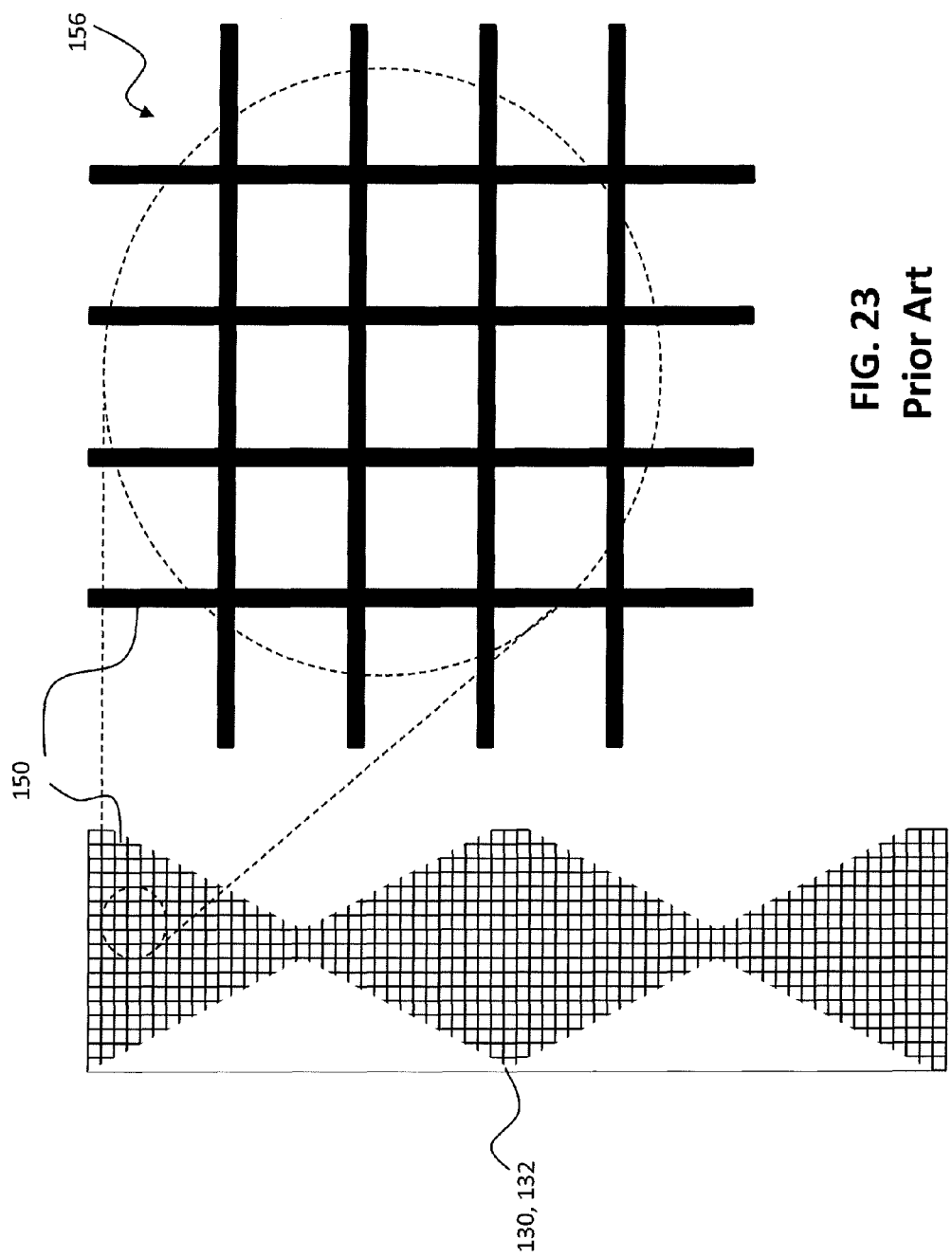
FIG. 23 is a prior-art schematic illustrating prior-art micro-wires in an apparently transparent electrode.
Figure 24:
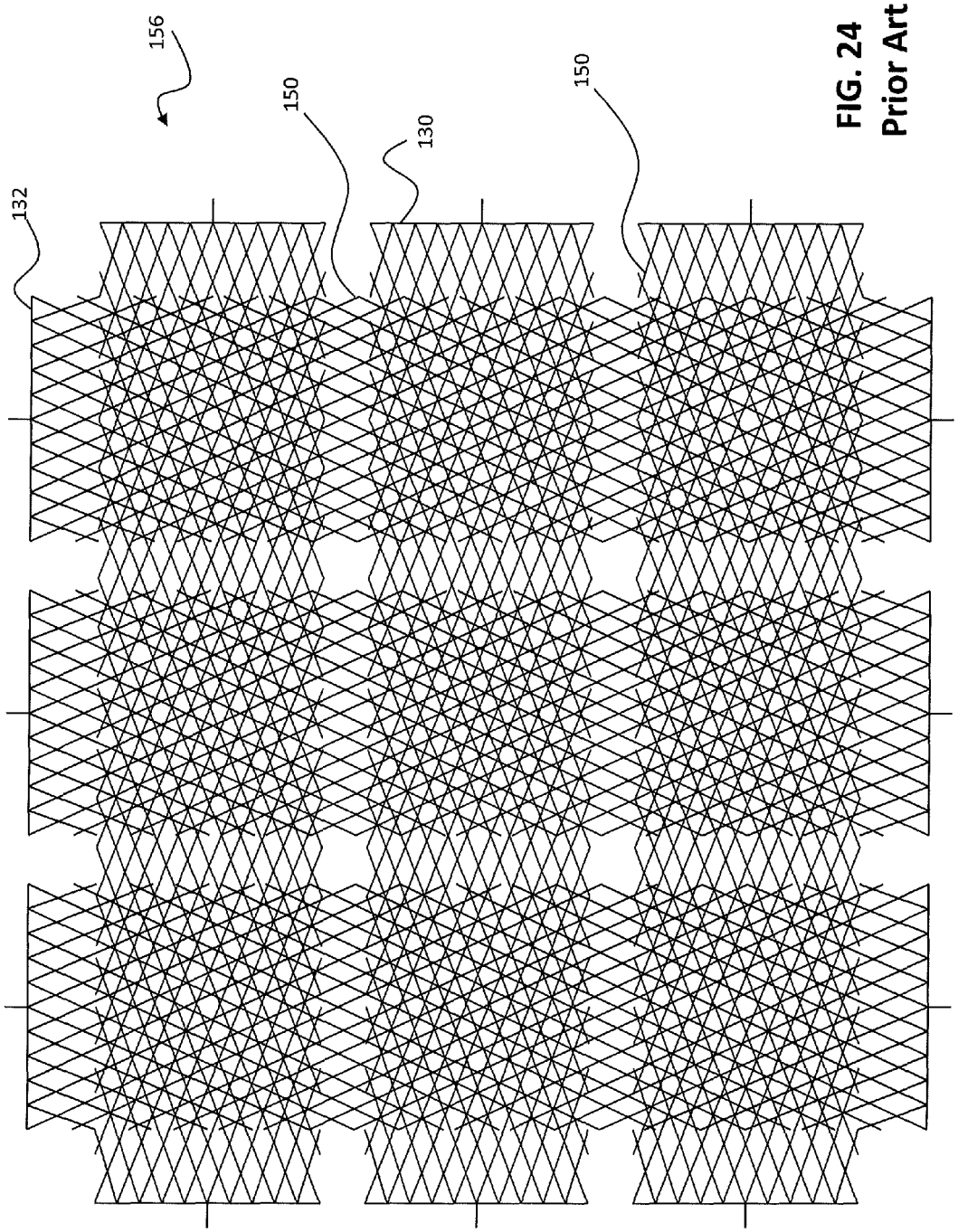
FIG. 24 is a prior-art schematic illustrating prior-art micro-wires arranged in two arrays of orthogonal transparent electrodes.

In an embodiment, ground lines 52 are formed from opaque metal wires or partially transparent metal oxide traces that conduct electricity. As illustrated in the plan view of FIG. 2 in an alternative embodiment, ground lines 52 and ground mesh 50 include micro-wires 55. Micro-wires 55 are small, electrically connected wires that are individually invisible to the human eye. Since the micro-wires 55 are spaced apart, although electrically connected, for example in a grid or diamond pattern (see FIGS. 23 and 24), a ground line 52 made up of micro-wires 55 is relatively transparent, further reducing the perceptibility of ground lines 52 to a viewer of display 40 and reducing any occlusion of light from pixels 20. A pattern of micro-wires 55 in a ground line 52 can be completely independent of a pattern of ground lines 52 or pixels 20.

Figure 2:
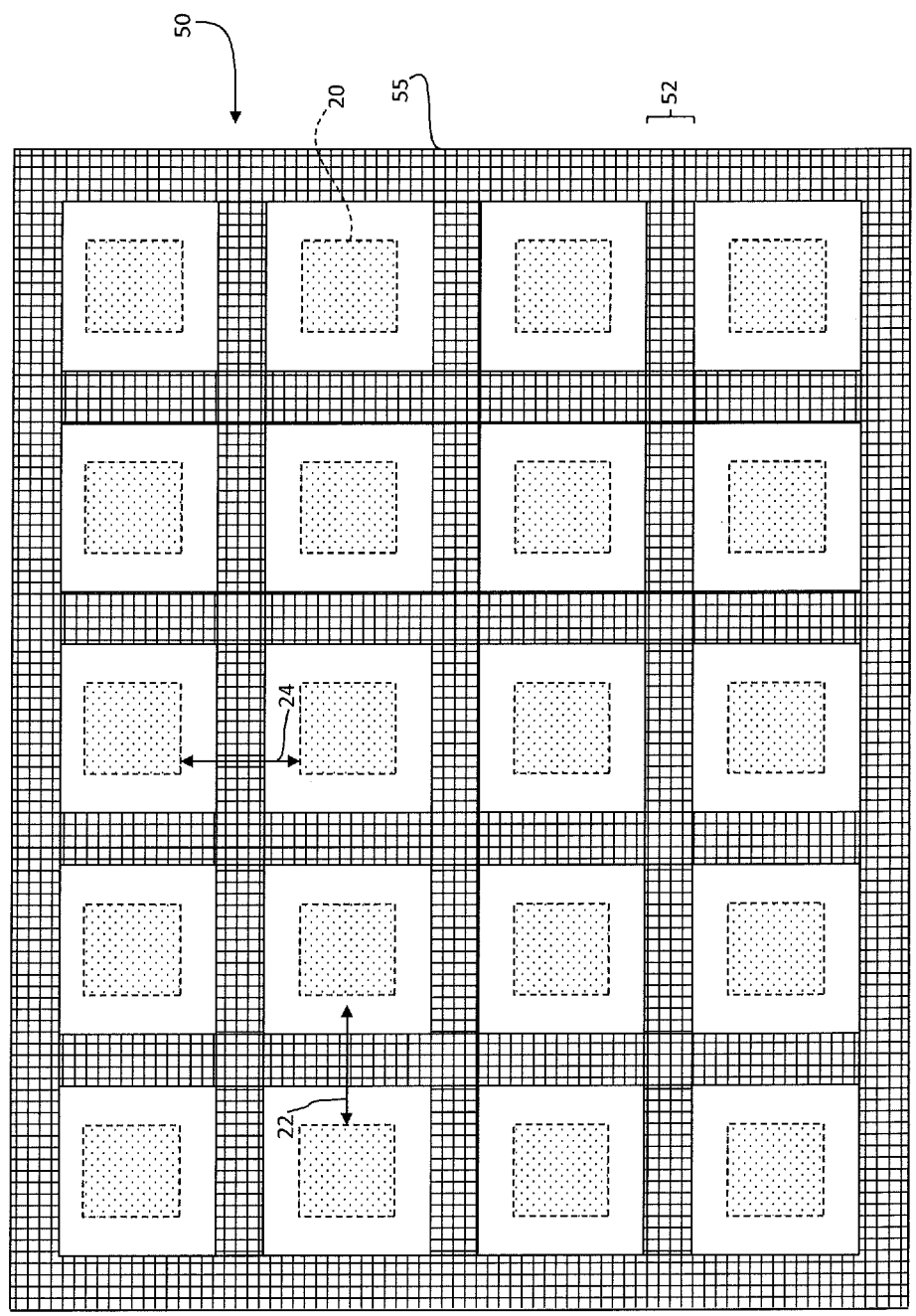
FIGS. 2-4 are plan views of embodiments of the present invention.
Figure 3:
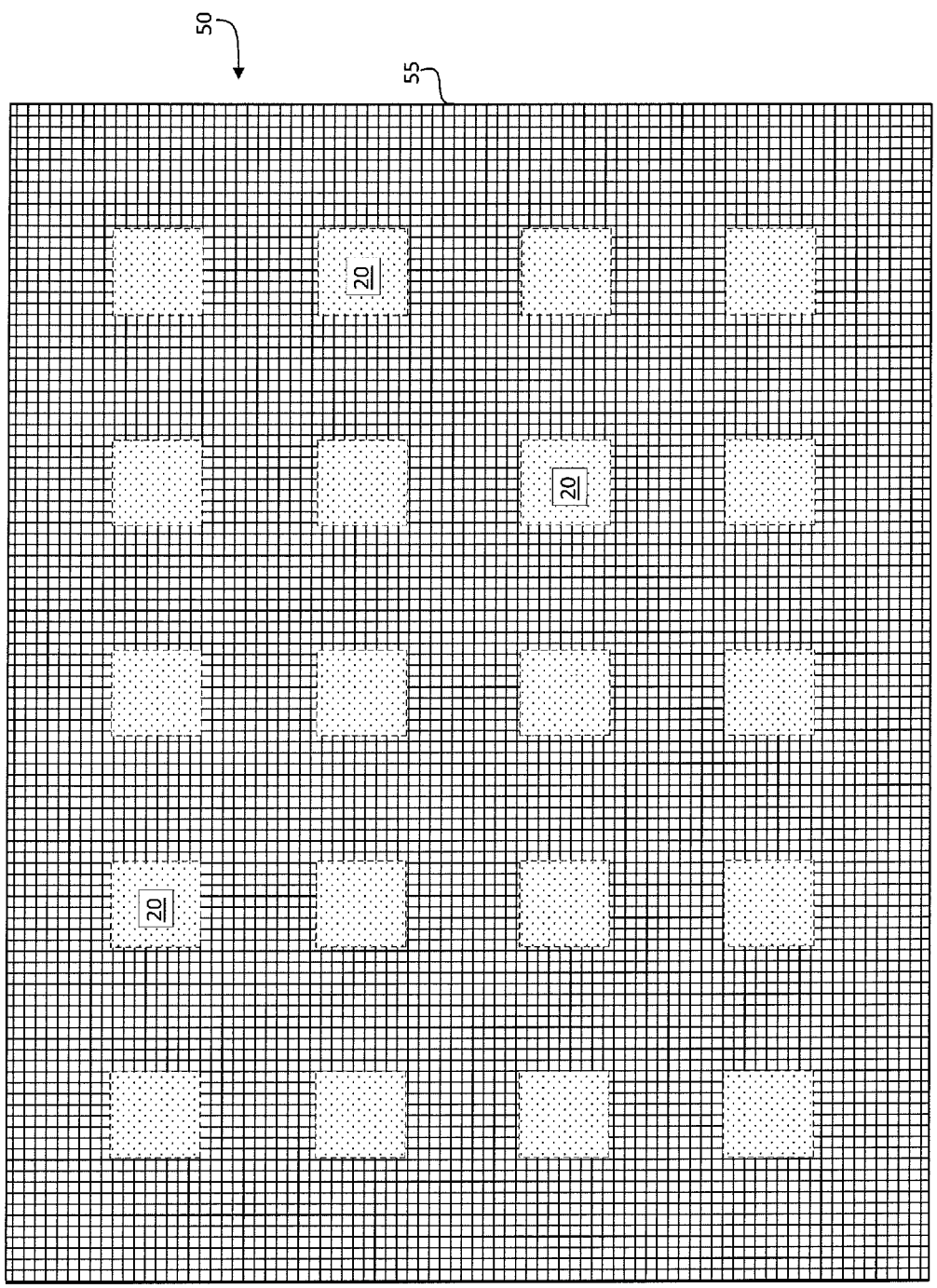

FIG. 2 illustrates ground lines 52 having micro-wires 55 within the row or column inter-pixel gaps 24, 22 between pixels 20 that do not substantially fill the row or column inter-pixel gaps 24, 22. Such a design reduces the potential occlusion of light controlled by pixels 20, especially when display 40 is viewed at an angle away from the perpendicular, but can also reduce the reception of electromagnetic radiation by ground mesh 50. Referring to FIG. 3 in another embodiment of the present invention, ground mesh 50 having micro-wires 55 substantially fills the row or column inter-pixel gaps 24, 22 between pixels 20. This design can be useful when the ground mesh 50 is close to pixels 20, for example formed on a layer above pixels 20.

Figure 4:
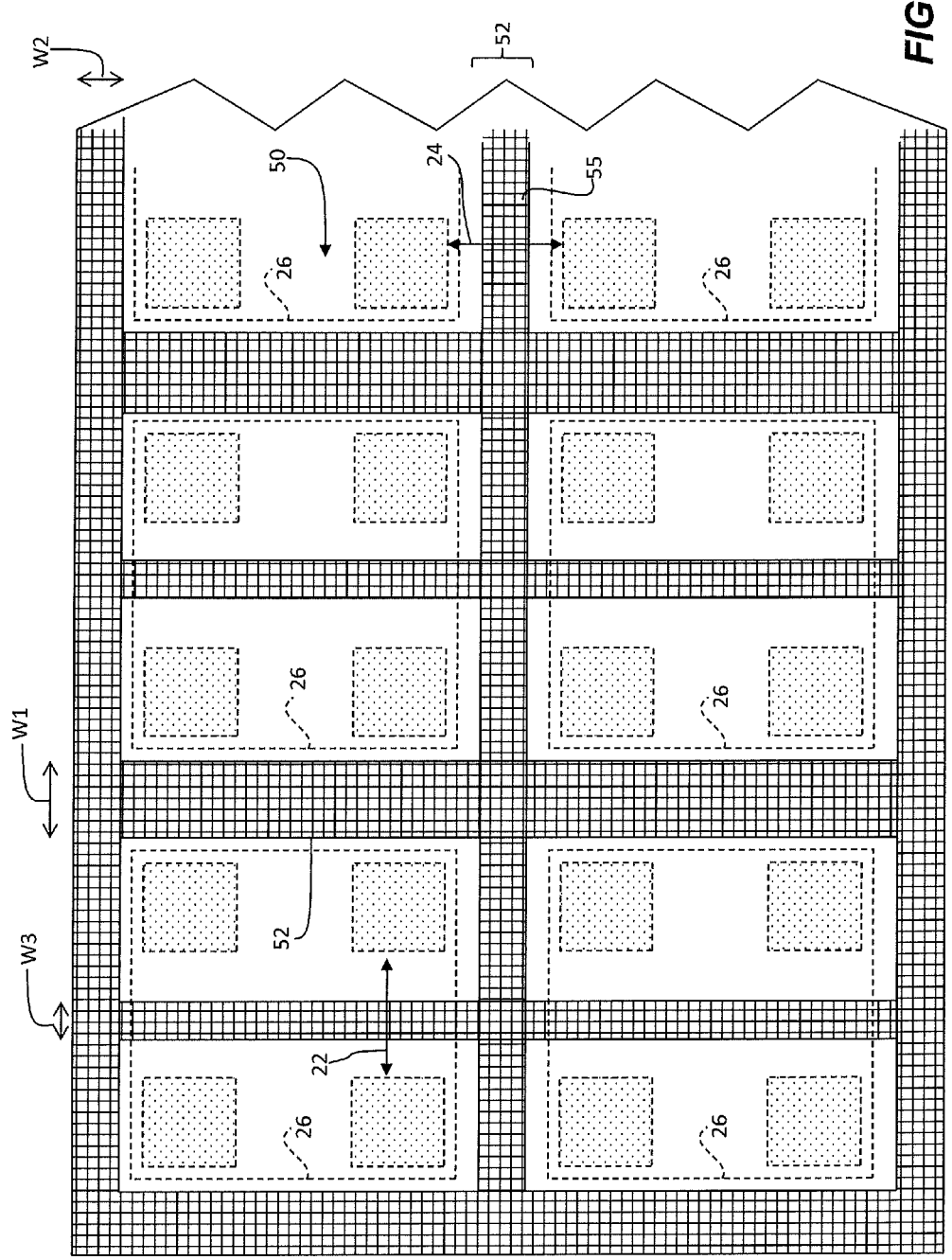

FIGS. 1, 2, and 3 illustrate identical ground lines 52 of ground mesh 50 between every pixel 20. Pixels 20 can be grouped into pixel groups 26, (FIG. 4) for example differently colored pixels such as red, green, blue, and white, and ground lines 52 formed between the pixel groups 26 rather than between every pixel 20. Since pixel groups 26 can be laid out as units with different spacing between the pixel groups 26 than between the pixels 20 within a pixel group 26, it can be useful to have a different arrangement of ground lines 52 between pixels 20 in a pixel group 26 than between pixel groups 26. As shown in the example of FIG. 4, ground lines 52 are present between every other row of pixels 20 and between every column of pixels 20. However, the ground lines 52 between pixels 20 in pixel groups 26 are relatively narrow, with a width W3 narrower than the width W1 of the column ground lines 52 between the pixel groups 26 or the row ground lines 52 having a width W2. Furthermore, the width of the column ground lines 52 with a width W1 between the pixel groups 26 are greater than the row ground lines 52 having a width W2. Thus, ground lines 52 in the row inter-pixel gaps 24 have a different width W2 than the ground lines 52 in the column inter-pixel gaps 22 W1 or W3. Furthermore, the various ground lines 52 making up ground mesh 50 can have other different attributes, for example different composition, materials, structure, layout, or pattern.

Figure 5:
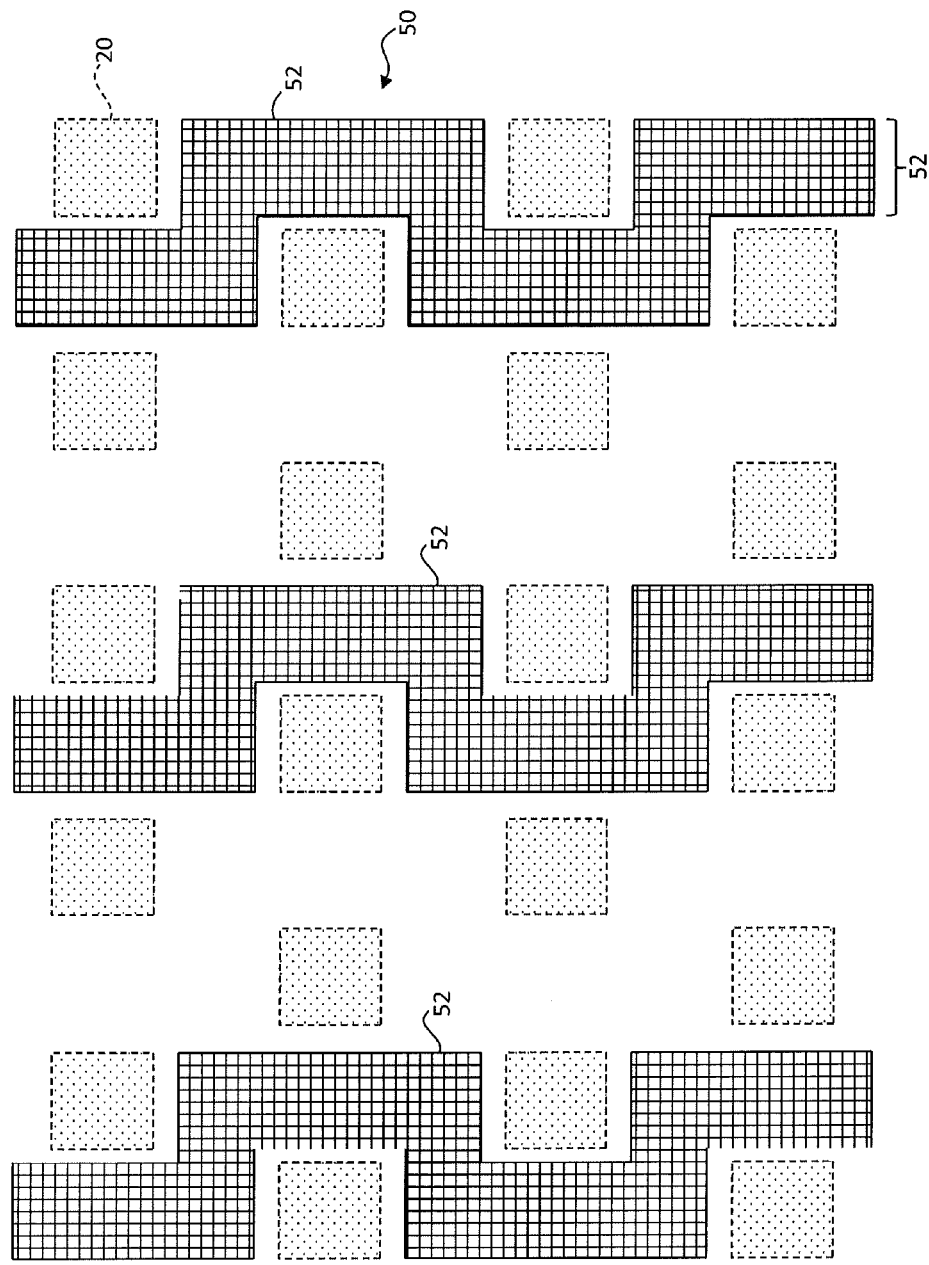
FIGS. 5-7 are plan views of embodiments of the present invention having offset pixel rows or columns.
Figure 6:
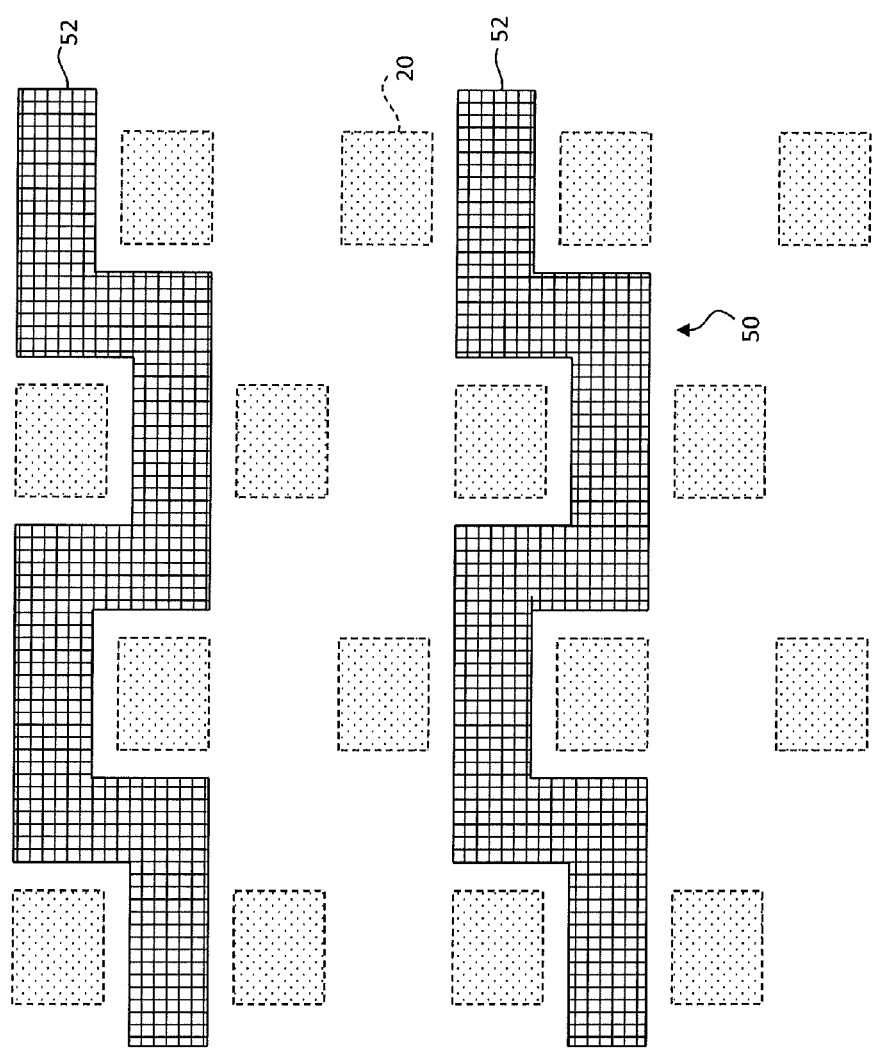
Figure 7:
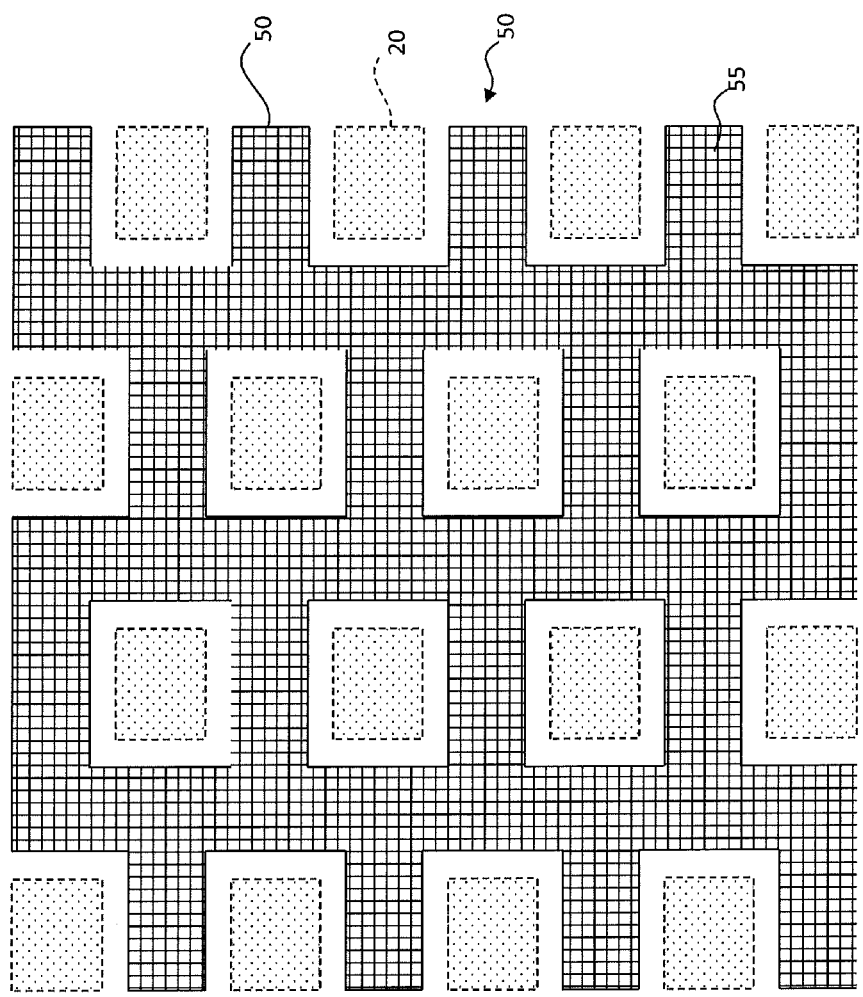

The rows and column of pixels 20 illustrated in FIGS. 1-4 are shown in straight lines. However, in other embodiments of the present invention, the rows and columns are arranged so that pixels 20 in rows or columns are offset with respect to each other so that rows or columns need not be straight. Likewise, ground lines 52 and micro-wires 55 included in ground mesh 50 are shown as straight, but need not be. Referring to FIG. 5, alternating rows of pixels 20 are offset and ground lines 52 of ground mesh 50, located between every other column of pixels 20 form a crenellated square wave pattern. In this embodiment, ground lines 52 are only formed in the column direction. Referring to FIG. 6, alternating columns of pixels 20 are offset and ground lines 52 of ground mesh 50, located between every other row of pixels 20, form a crenellated square wave pattern. In this embodiment, ground lines 52 are only formed in the row direction. In an embodiment, ground lines 52 of ground mesh 50 including micro-wires 55 are located between only a subset of pixels 20, for example every other pixel 20. Referring to FIG. 7, alternating columns of pixels 20 are offset and ground mesh 50 is located between both rows and columns of pixels 20 but does not completely fill the row or column inter-pixel gaps 24, 22 (not shown).

In a further embodiment of the present invention, and as further illustrated in FIG. 1, display 40 can include a display ground 135, for example a wire connected to a ground signal in display 40, or touch screen 30 can include a touch-screen ground 137. The display ground 135 or touch-screen ground 137 is electrically connected to ground mesh 50, for example through wire 134. Any two or all three of the ground signals can be electrically connected. By electrically connecting the ground signals from the ground mesh 50, the display 40, and the touch screen 30, either directly or through a controller 90 as illustrated, further reduces electrical noise in the display apparatus 10. Ground signals and electrical connections are well known in the electrical engineering arts.

Figure 25:
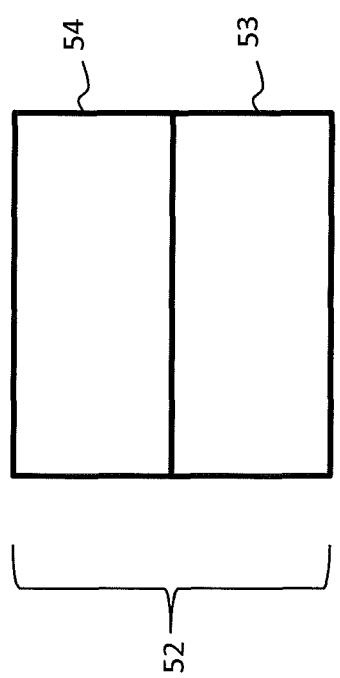
FIG. 25 is a cross section illustrating a two-layer ground line according to an embodiment of the present invention.

In a further embodiment of the present invention, the ground lines 52 are black. Materials, for example silver, can form black conductors and are known in the art. In an alternative embodiment of FIG. 25, a second light-absorbing layer 54 is formed above or below, or above and below, a first electrically conducting layer 53 in ground line 52 to absorb light. Such absorption can reduce reflectance from display apparatus 10 and improve the contrast of display 40. Other color conductors or light absorbers can be used and are known in the art. Light absorbers such as carbon black, dyes, or pigments can be used.

The components, design, and construction of displays 40, touch screens 30, for example capacitive touch screens, are known in the art. Mesh structures of electrically conductive ground wires, ground traces, or micro-wires formed on a substrate are also known in the art, as is their control and electrical connection. The integration of displays 40, touch screens 30, and ground mesh 50 structures can be accomplished using methods known in the art. Methods of making such structures according to various embodiments of the present invention are now discussed in more detail.

Figure 8:
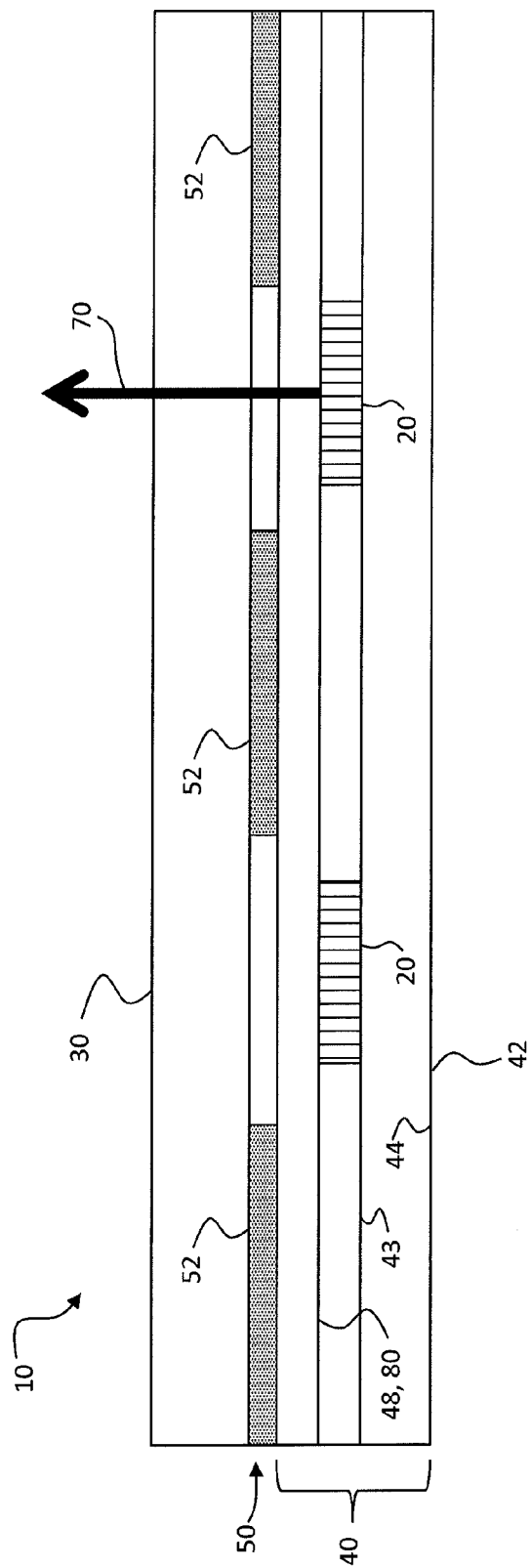
FIG. 8 is a cross section of an embodiment of the present invention.
Figure 14:
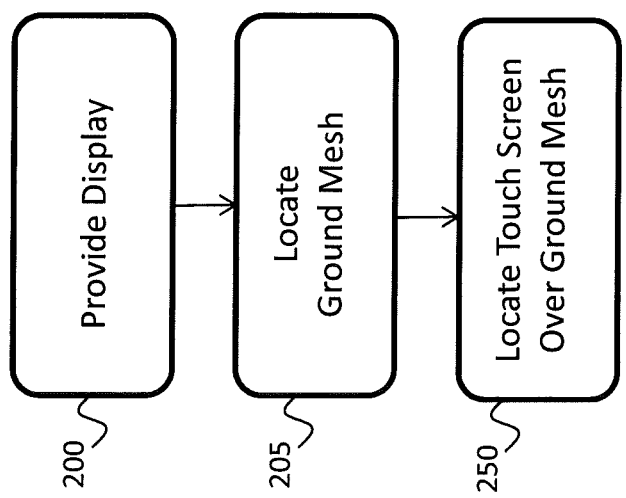
FIGS. 14-19 are flow diagrams illustrating embodiments of the present invention.

The structure of display apparatus 10 can be constructed using a variety of methods. Referring first to FIG. 8, a display 40 includes a display substrate 42 having a pixel side 43 and an opposite side 44. Formed on or in display substrate 42 on pixel side 43 are pixels 20, over which a protective layer 80 is located. Protective layer 80 can be a display cover 48 laminated over pixels 20 or a protective layer 80 coated over pixels 20. Electrically conductive ground lines 52 are located over protective layer 80, forming ground mesh 50. Ground lines 52 can be formed on protective layer 80 (e.g. by coating and patterned processing or by patterned deposition) or laminated to protective layer 80. Touch screen 30 is located over ground mesh 50 and protects ground mesh 50. Light 70 emitted, reflected, or transmitted by pixels 20 passes between ground lines 52 to a viewer. Thus, in one embodiment according to the present invention and also referring to FIG. 14, a method of making a display apparatus 10 includes providing 200 a display 40 having an array of pixels 20, locating 205 a ground mesh 50 in proximity to the display 40, the ground mesh 50 including a plurality of electrically connected ground lines 52 located between the pixels 20, so that electro-magnetic radiation emitted or received by the display 40 is reduced. In a further embodiment, a touch screen 30 is located 250 over the ground mesh 50.

Figure 9:
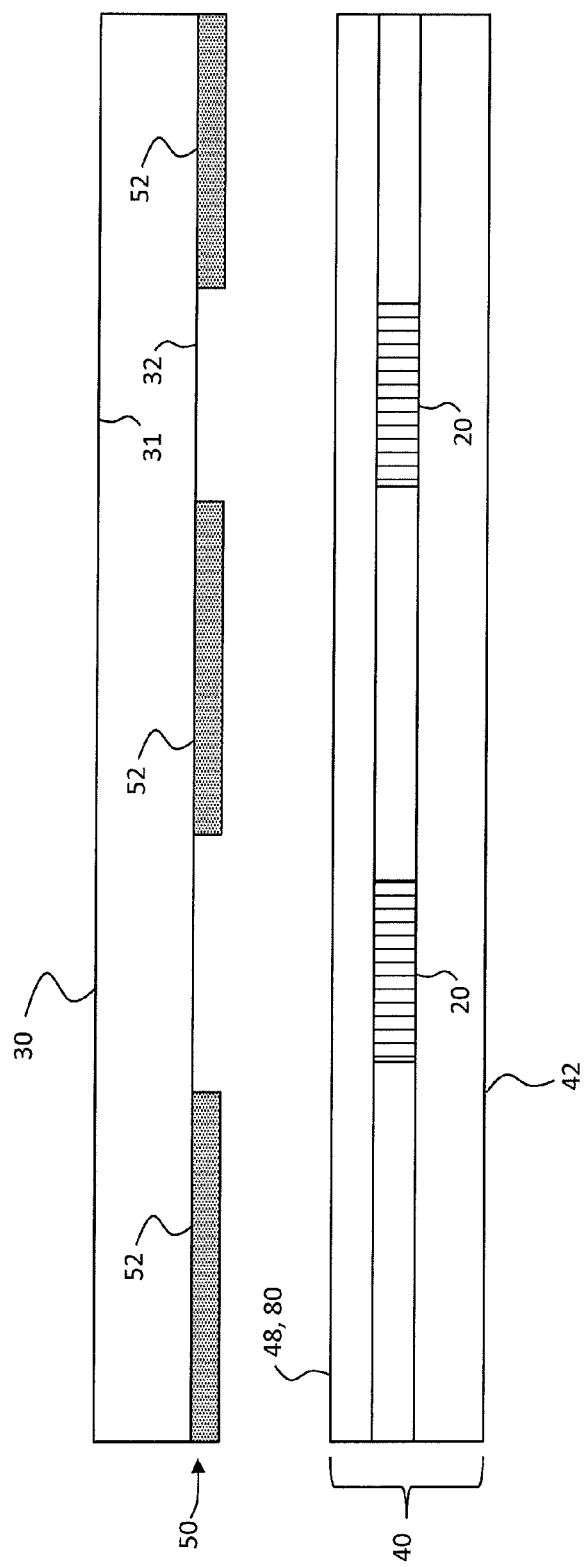
FIGS. 9-10 are exploded cross sections of embodiments of the present invention.

Referring to FIG. 9, ground lines 52 making up ground mesh 50 can be formed on or laminated to a ground side 32 of a touch screen 30 substrate having a touch-screen side 31 and ground side 32. Protective layer 80 of display 40 can be a display cover 48 and is laminated to touch screen 30 with ground mesh 50 located between touch screen 30 and pixels 20 with pixels 20 between ground mesh 50 and display substrate 42. Alternatively, referring to FIG. 10, ground lines 52 making up ground mesh 50 can be formed on a substrate of display 40, for example on protective layer 80 or on display cover 48. Ground lines 52 can be formed on display cover 48 before or after display cover 48 (or protective layer 80) is integrated into display 40. Protective layer 80 or display cover 48 is laminated to touch screen 30 with ground mesh 50 located between touch screen 30 and pixels 20 with pixels 20 between ground mesh 50 and display substrate 42. Display cover 48 (or protective layer 80) can be laminated to touch screen 30 before or after display cover 48 or protective layer 80) is integrated into display 40.

In another embodiment (not shown), ground mesh 50 is formed on a ground substrate separate from display 40 or touch screen 30. One side of the ground substrate can be laminated to display 40 and the other side of the ground substrate can be laminated to touch screen 30 in any order or at the same time.

Figure 15:
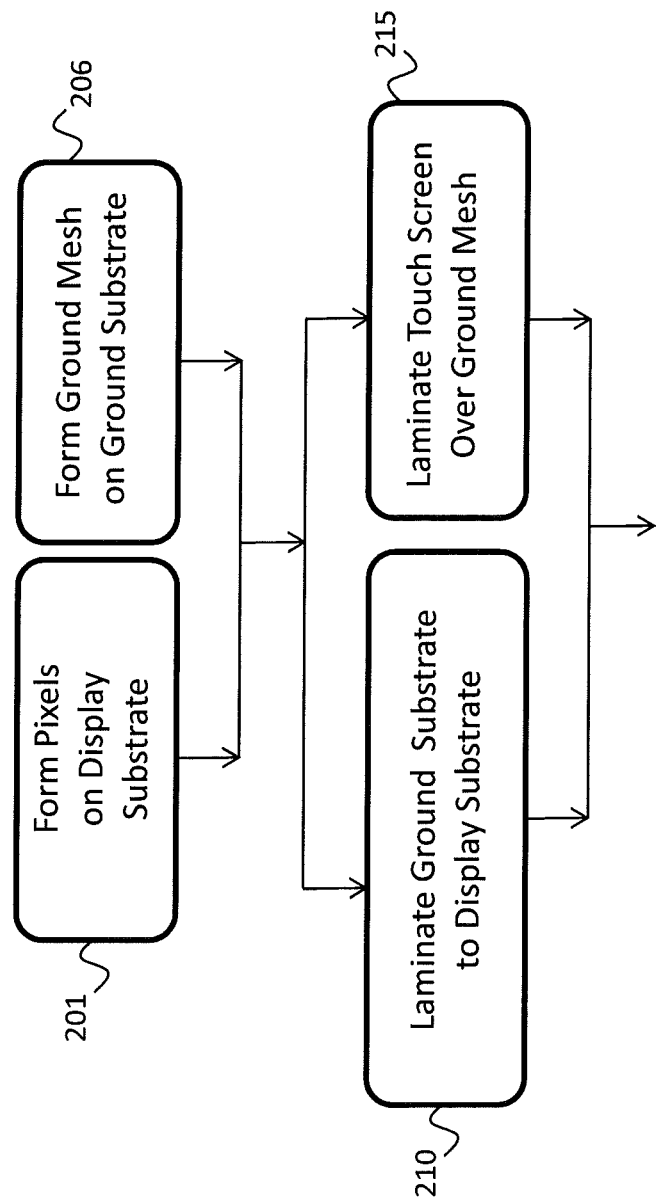

Referring to FIG. 15, pixels 20 are formed 201 on display substrate 42 independently of forming 206 ground mesh 50 on a ground substrate separate from the display 40, display substrate 42, or touch screen 30. The ground substrate is laminated 210 to a display substrate (e.g. either display cover 48 or display substrate 42) and touch screen 30 is laminated 215 over ground mesh 50. The ground substrate is laminated to touch screen 30 before or at the same time that the ground substrate is laminated 210 to a display substrate (e.g. display cover 48 or display substrate 42). The order in which the various substrates are laminated together can vary as will be appreciated by one skilled in the assembly arts and different orders are included in the present invention. Furthermore, although FIG. 15 describes laminating the various elements together, in an alternative embodiment, the elements are sequentially formed in layers, for example by coating, patterned deposition, sputtering, or masking and etching as will be discussed further below.

Figure 10:
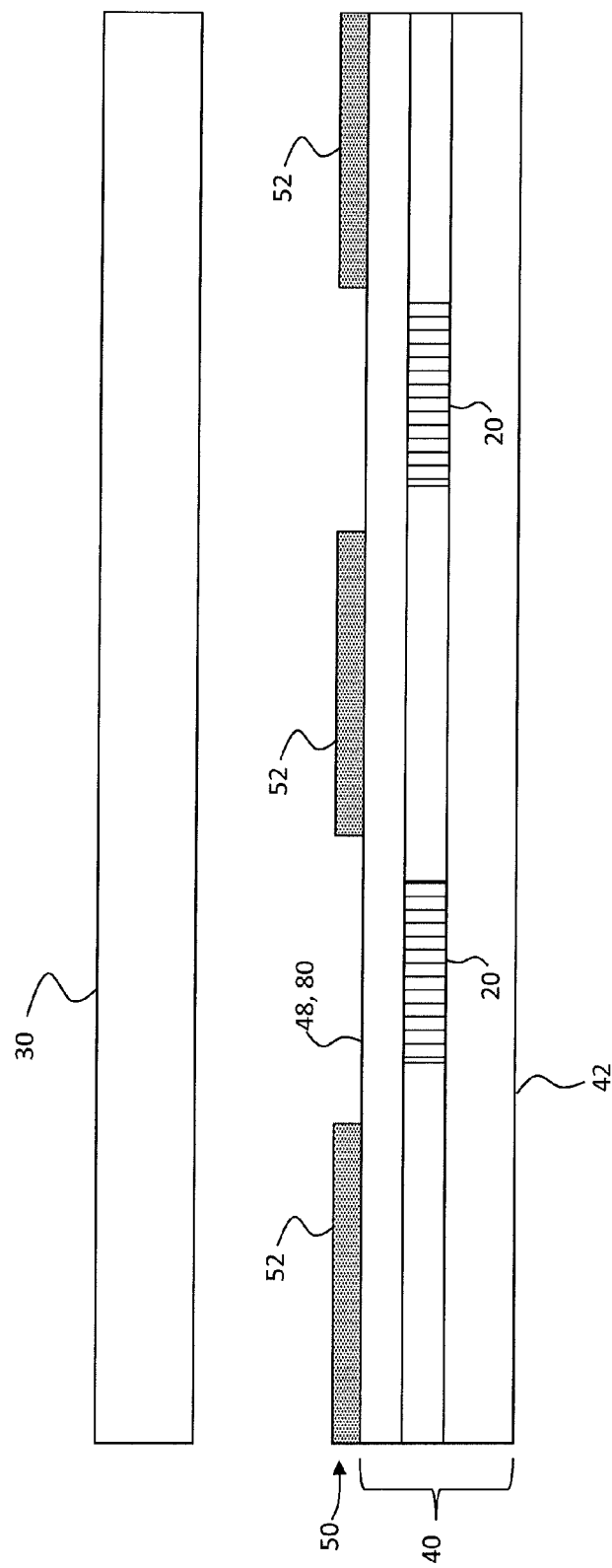

As illustrated in FIGS. 8-10, display 40 is formed on a display substrate 42 having a pixel side 43 on or over which pixels 20 are formed and ground mesh 50 is located on pixel side 43. In an alternative embodiment illustrated in FIG. 11, display apparatus 10 includes display 40 formed on a display substrate 42 having a pixel side 43 on or over which the pixels 20 are formed and an opposite side 44. The ground lines 52 making up ground mesh 50 are located on opposite side 44, so that light 70 controlled by pixel 20 passes through display substrate 42 and touch screen 30 rather than through display cover 48 (protective layer 80).

Figure 12:
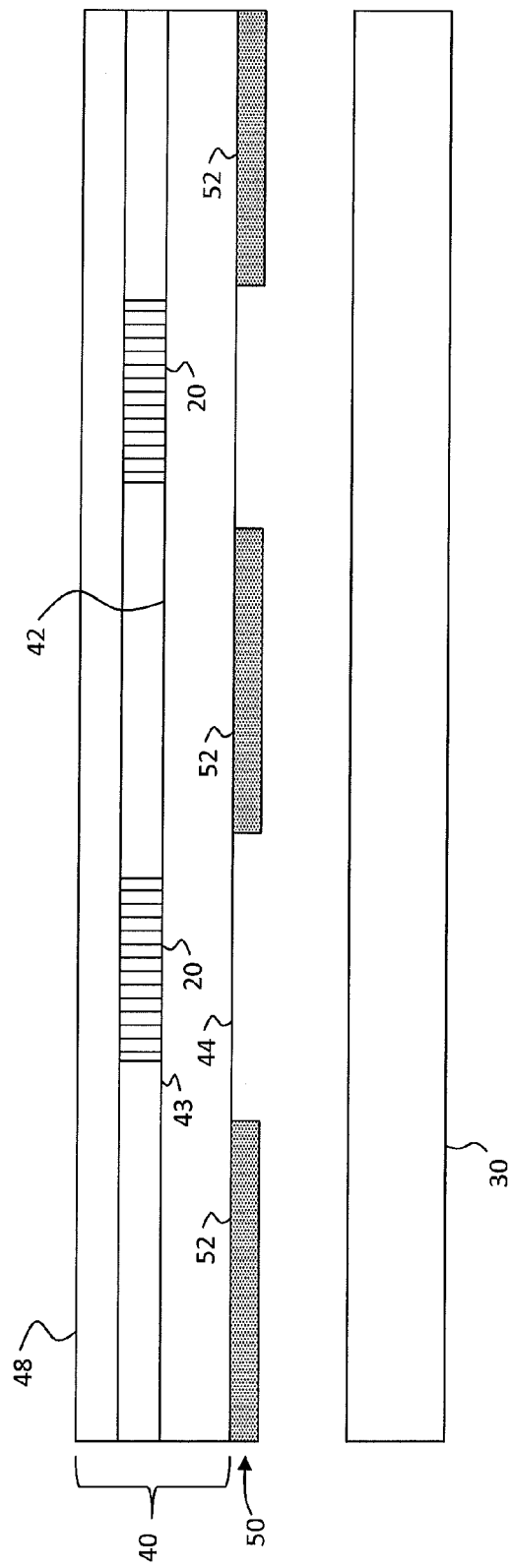
FIGS. 12-13 are exploded cross sections of embodiments of the present invention.
Figure 13:
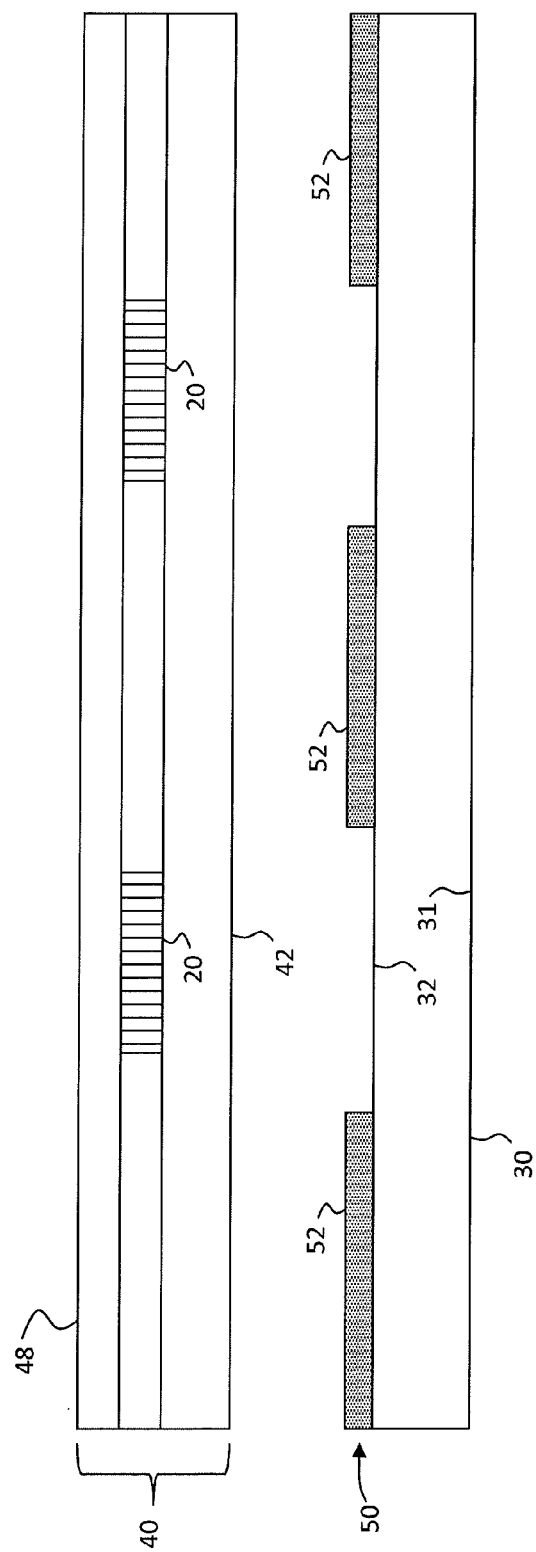

Referring further to FIG. 12, ground lines 52 making up ground mesh 50 are formed on display substrate 42 on opposite side 44 of display substrate 42, so that ground mesh 50 is opposite pixels 20 and display cover 48 of display 40. Pixels 20 are formed on pixel side 43 of display substrate 42 opposite ground mesh 50 and touch screen 30. Touch screen 30 is then located (e.g. by lamination) adjacent to ground mesh 50. Alternatively, referring to FIG. 13, ground lines 52 making up ground mesh 50 are formed on touch screen 30 and located (e.g. by lamination) adjacent display substrate 42 on a side of display substrate 42 opposite pixels 20 and display cover 48 of display 40. In such an embodiment, touch screen 30 is formed on a touch-screen substrate having a touch-screen side 31 and a ground side 32 and ground mesh 50 is provided on ground side 32.

Figure 11:
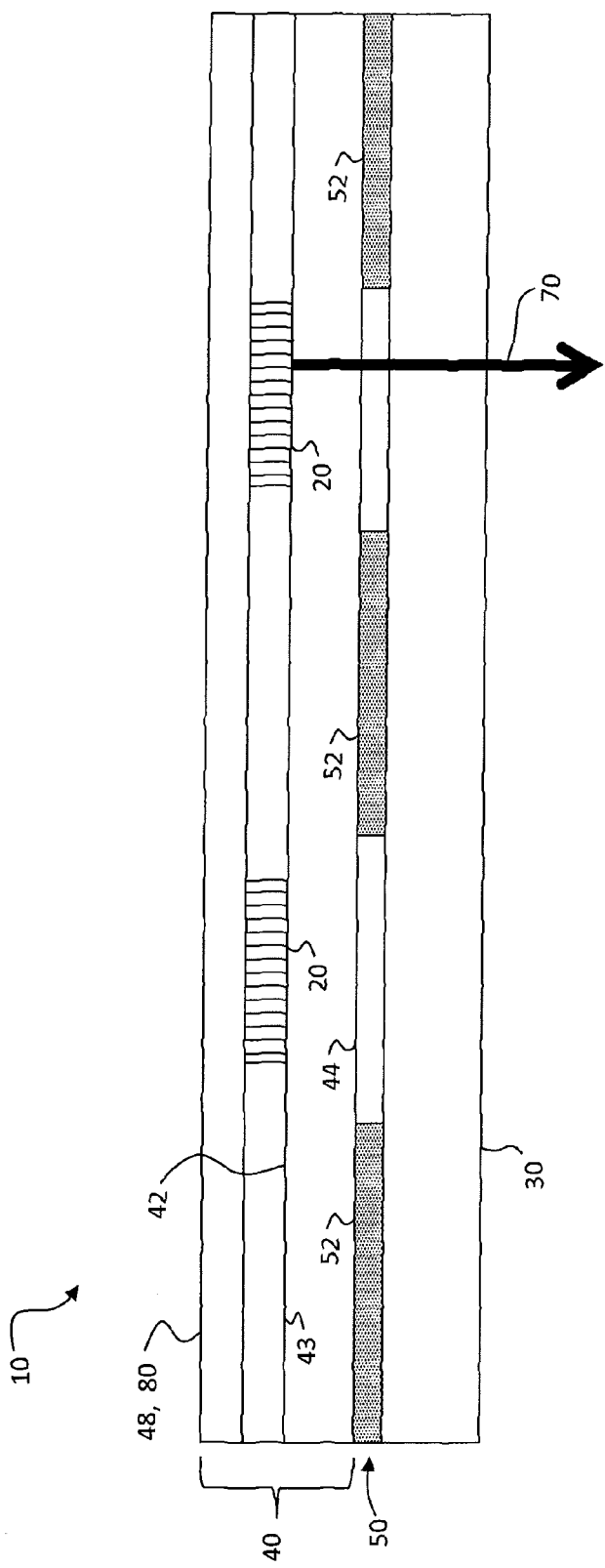
FIG. 11 is a cross section of another embodiment of the present invention.
Figure 16:
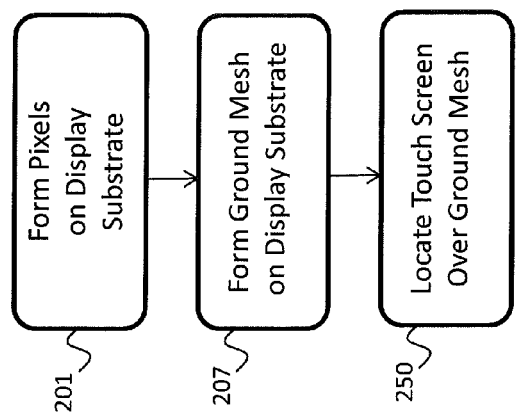

Referring to FIG. 16 in a method of the present invention, pixels 20 are formed 201 on display substrate 42. Ground mesh 50 is formed 207 on or over display substrate 42 and touch screen 30 is located 250 over ground mesh 50. Ground mesh 50 can be formed on or over either pixel side 43 of display substrate 42 (as illustrated in FIG. 8) or on opposite side 44 of display substrate 42 (as illustrated in FIG. 11). Ground mesh 50 can be formed on or over display substrate 42 (e.g. by coating) or applied to display substrate 42 (e.g. by lamination). Likewise, touch screen 30 can be formed on or over ground mesh 50 (e.g. by coating) or applied to a substrate on which ground mesh 50 is formed (e.g. by lamination).

Figure 17:
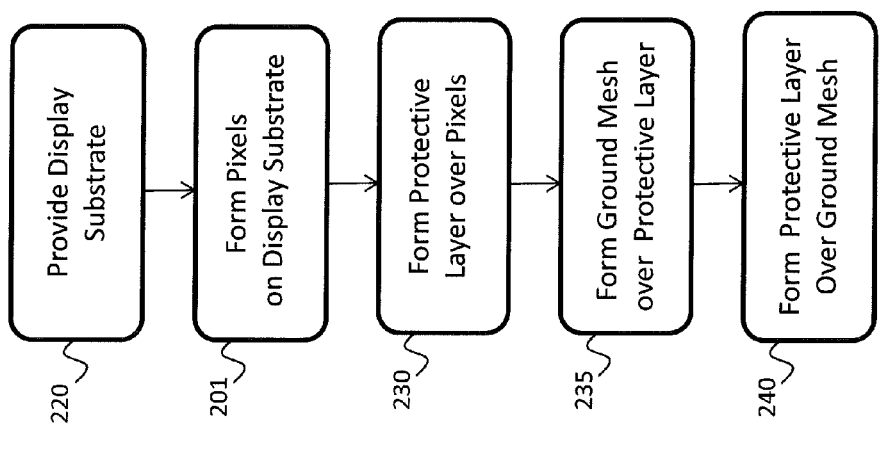

In an embodiment illustrated in FIG. 17, display 40 is provided 220 and pixels 20 formed 201 on pixel side 43 of display substrate 42. Protective layer 80 is formed 230 on or over pixels 20. Ground mesh 50 is formed 235 on or over protective layer 80 and a ground protective layer formed 240 on or over ground mesh 50. A ground protective layer can be, for example, display cover 48 or a substrate of touch screen 30. Alternatively, a ground protective layer can be coated or laminated on or over ground mesh 50.

Figures 18, 19:
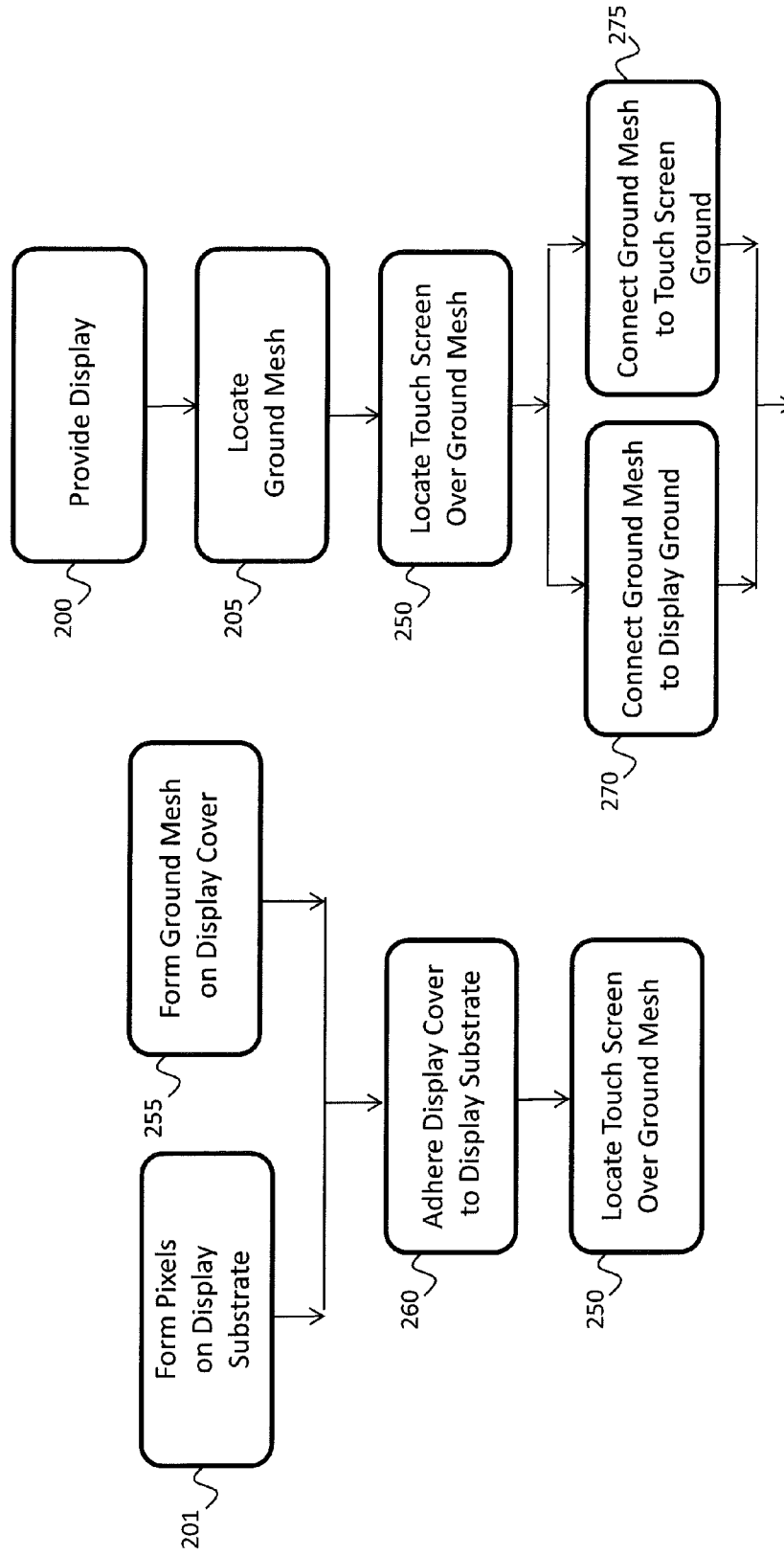

As illustrated in FIG. 18, pixels 20 are formed 201 on display substrate 42 and ground mesh 50 formed 255 on display cover 48 (or a protective layer 80). Display cover 48 is adhered 260 to display substrate 42 to complete display 40. Touch screen 30 is located 250 over ground mesh 50, for example by laminating a touch screen 30 to display 40 or forming touch screen 30 on display cover 48.

As noted with respect to FIG. 1, as illustrated in FIG. 19 in a method of the present invention, display 40 is provided 200 and ground mesh 50 located 205 in alignment with pixels 20 of display 40. Touch screen 30 is located 250 over ground mesh 50 so that ground mesh 50 is between touch screen 30 and display 40. A display ground is electrically connected 270 to ground mesh 50. Alternatively or in addition, a touch-screen ground is electrically connected 275 to ground mesh 50. The display ground can be electrically connected to the touch-screen ground.

The provision of substrates, for example glass, for the construction of displays 40 or various display elements such as pixels 20 or display covers 48 are well known, as are method for making displays 40. Likewise, the provision of substrates, for example glass, for the construction of touch screens 30 are well known, as are method for making touch screens 30. Ground mesh 50 can be formed on similar substrates or on or over substrates (e.g. display substrate 42 or display cover 48) in display 40 or on or over substrates found in touch screen 30. Coating methods for forming layers such as protective layer 80 or layers of ground lines 52 are known as are lamination methods for laminating structures together, for example display substrate 42 and touch screen 30. Methods and materials for forming ground signals in displays 40 and touch screens 30, and electrically connecting them, for example with wires, are also known.

The present invention reduces the presence of electromagnetic interference between displays 40 and adjacent touch screens 30 in display apparatus 10. Ambient electromagnetic interference from other sources is also reduced. Ground mesh 50 can also provide an anti-static layer during handling of touch screen 30 (when formed on a substrate of touch screen 30) before lamination or integration with display 40. Similarly, ground mesh 50 can provide an anti-static layer during handling of display 40 (when formed on a substrate of display 40, e.g. display cover 48 or display substrate 42) before lamination or integration with touch screen 30.

A touch-screen 30 includes a substrate such as dielectric layer 124 located over display 40. Touch screen 30 has row electrodes located on a row side of dielectric layer 124 and column electrodes located on a column side of dielectric layer 124 so that row and column electrodes are separated by dielectric layer 124.

Figure 20:
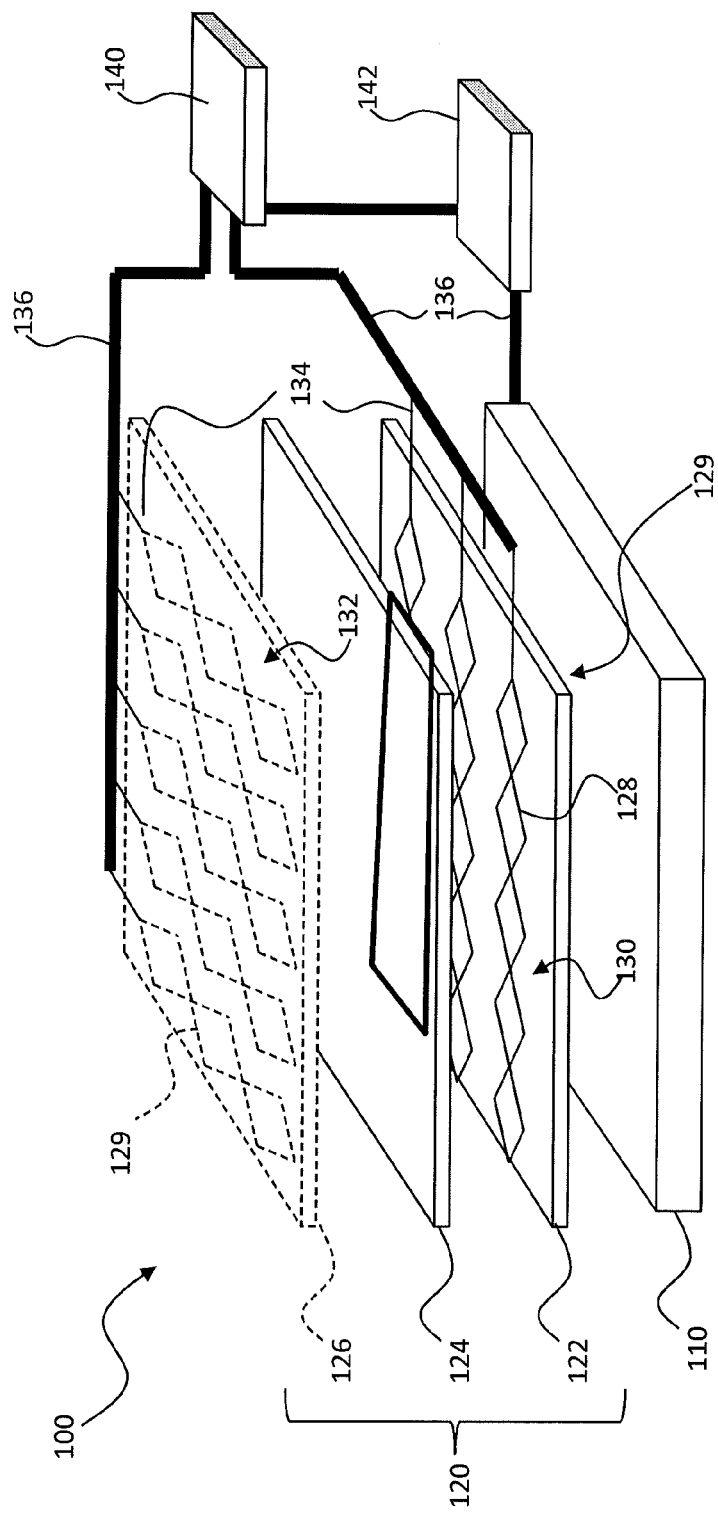
FIG. 20 is a prior-art exploded perspective illustrating a prior-art mutual capacitive touch screen having adjacent pad areas in conjunction with a display and controllers.
Figure 21:
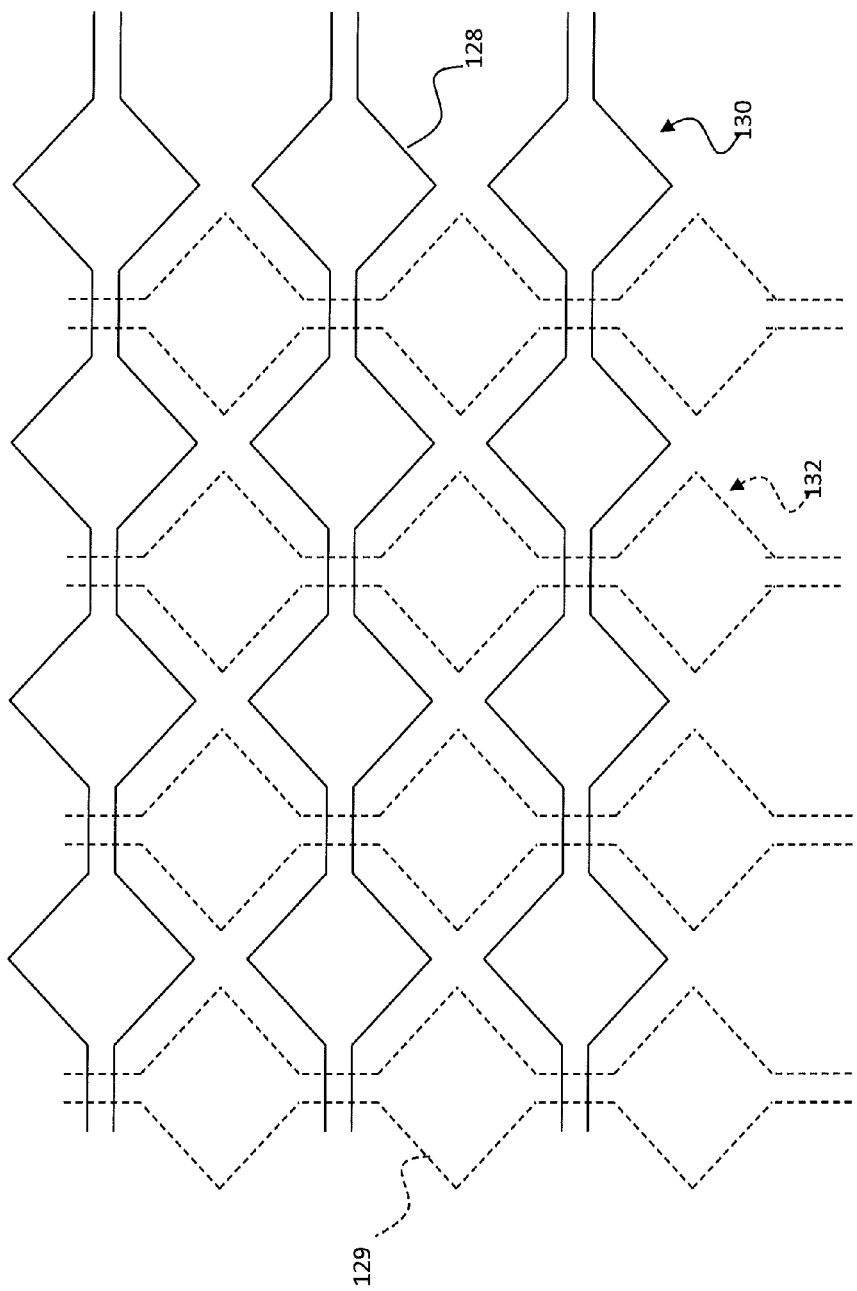
FIG. 21 is a prior-art schematic illustrating prior-art adjacent pad areas in a capacitive touch screen.
Figure 22:
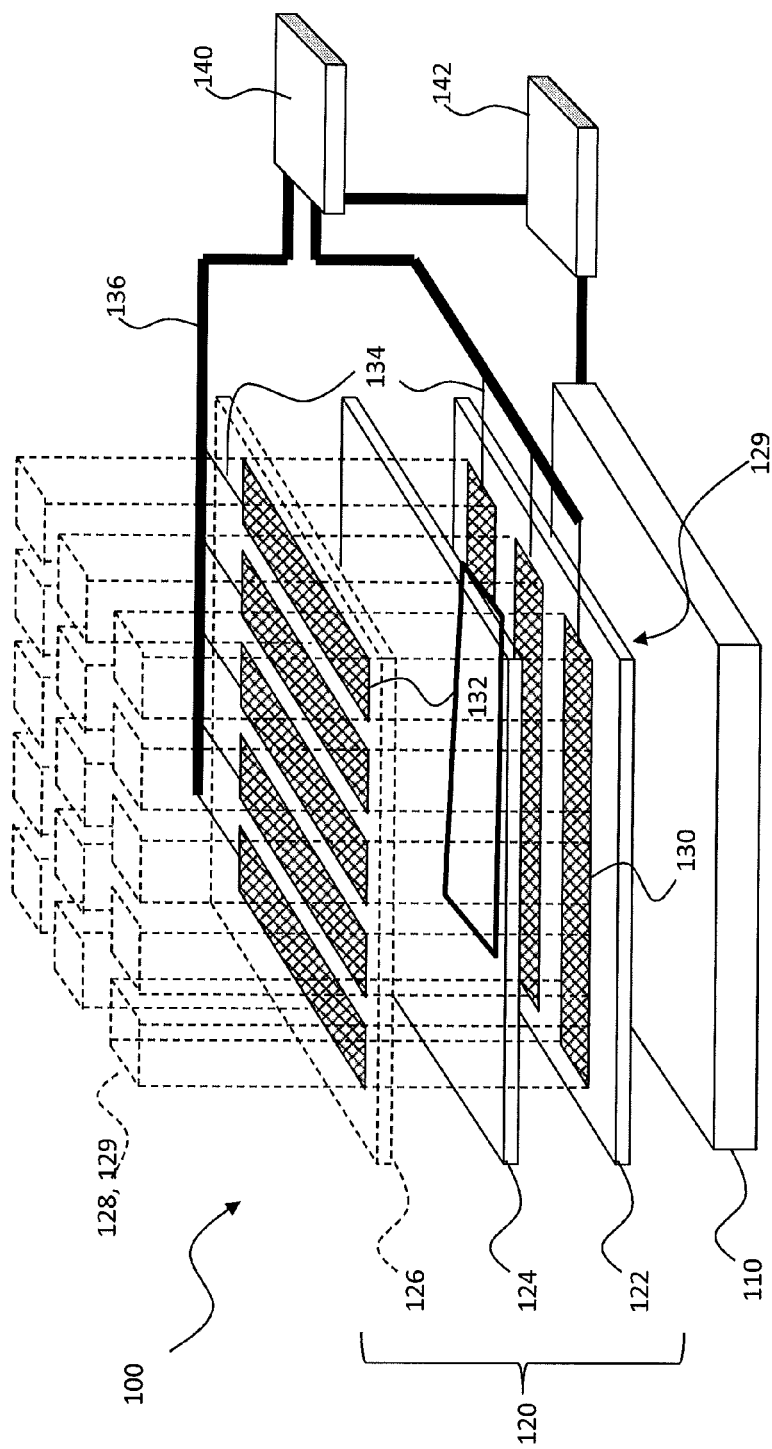
FIG. 22 is a prior-art exploded perspective illustrating a prior-art mutual capacitive touch screen having overlapping pad areas in conjunction with a display and controllers.

Display apparatus 10 of the present invention can be operated by using display controller 142 (as shown in FIG. 20) to control the display 40 to display information with pixels 20, for example by providing power and signals to pixel electrodes, thin-film transistors, electrical busses, and passive electrical components such as resistors and capacitors found in display 40. Touch screen controller 140 (as shown in FIG. 20) provides a voltage differential sequentially to touch screen row and column electrodes (not shown) to scan the capacitance of the capacitor array formed where the touch screen row and column electrodes overlap. Any change in the capacitance of a capacitor in the capacitor array can indicate a touch at the location of the capacitor in the capacitor array. The location of the touch can be related to information presented on one or more pixels 20 at the corresponding pixel location to indicate an action or interest in the information present at the corresponding pixel location.

By providing power and signals to electrodes, transistors, and other electrical components in display 40 and energizing the electrodes in touch screen 30, electromagnetic radiation is produced. In the absence of ground mesh 50, this electromagnetic radiation is then received by the components in display 40 or touch screen 30 forming spurious signals or electrical signal noise that can cause the display 40 or touch screen 30 to operate incorrectly, at a lower rate (for example reducing refresh or scanning rates), or with less accurate, more noisy, signals. According to the present invention, by locating ground mesh 50 adjacent display 40 or between touch screen 30 and display 40, such electromagnetic interference is reduced and display apparatus 10 operation is more accurate, less noisy, or has a higher rate with fewer errors.

As will be readily understood by those familiar with the lithographic and display design arts, the terms row and column are arbitrary designations of two different, usually orthogonal, dimensions in a two-dimensional arrangement of pixels on a surface, for example a substrate surface, and can be exchanged. That is, a row can be considered as a column and a column considered as a row simply by rotating the surface ninety degrees with respect to a viewer. Thus, the nomenclature for rows and columns can be exchanged. Being formed on, over, or under a substrate side includes being formed on layers formed on a substrate side. Over and under are relative terms that can be exchanged.

In an embodiment, because micro-wires 55 in ground lines 52 do not substantially occlude any light emitted, transmitted, or reflected by pixels 20, ground mesh 50 formed from micro-wires 55 does not interfere with display 40 and, furthermore, can be apparently transparent, thus improving the visual transparency of a device or device formed with such a ground mesh 50 and avoiding any visible interaction between ground mesh 50 and light emitted or reflected from display 40 located under or behind ground mesh 50.

In one embodiment of the present invention, micro-wires 55 are the only conductive elements in ground mesh 50. In another embodiment, additional conductivity is provided to ground mesh 50 by a transparent conductor located between pixels 20 in electrical contact with micro-wires 55 located in the column and row inter-pixel gaps 22, 24. Transparent conductors can be, for example, a transparent metal oxide conductor (TCO) such as indium tin oxide or aluminum oxide. Furthermore, micro-wires 55 can be black, for example including black silver or having a coating of light-absorbing material such as carbon black, a dye, or pigment.

Display substrate 42 can have a substantially planar pixel side 43 on which pixels 20 are correspondingly located and a substantially planar opposite side 44 opposed to pixel side 43. The pixel and opposite sides 43, 44 can be substantially parallel. Pixels 20 are formed on pixel side 43 or on one or more layers on pixel side 43. In various embodiments, ground mesh 50 is formed on opposite side 44 or on one or more layers on opposite side 44 before or after pixels 20 are formed on pixel side 43 of display substrate 42.

Substrates of the present invention can include any material capable of providing a supporting surface on which micro-wires 55 or display elements can be formed and patterned. Substrates such as glass, metal, or plastics can be used and are known in the art together with methods for providing suitable surfaces. In a useful embodiment, substrates are substantially transparent, for example, having a transparency of greater than 90%, 80% 70% or 50% in the visible range of electromagnetic radiation.

Various substrates of the present invention can be similar substrates, for example made of similar materials and having similar material deposited and patterned thereon. Likewise, electrodes or ground lines 52 of the present invention can be similar, for example made of similar materials using similar processes.

Ground lines 52 of the present invention can be formed directly on substrates or over substrates or on layers formed on substrates. The words "on", "over', or the phrase "on or over" indicate that the ground lines 52 or micro-wires 55 of the present invention can be formed directly on a substrate, on layers formed on a substrate, or on other layers or another substrate located so that the ground lines 52 or micro-wires 55 are over the desired substrate. Likewise, ground lines 52 or micro-wires 55 can be formed under or beneath substrates. The words "on", "under", "beneath" or the phrase "on or under" indicate that the ground lines 52 or micro-wires 55 of the present invention can be formed directly on a substrate, on layers formed on a substrate, or on other layers or another substrate located so that the electrodes are under the desired substrate. "Over" or "under", as used in the present disclosure, are simply relative terms for layers located on or adjacent to opposing surfaces of a substrate. By flipping the substrate and related structures over, layers that are over the substrate become under the substrate and layers that are under the substrate become over the substrate. The descriptive use of "over" or "under" do not limit the structures of the present invention.

In an embodiment of the present invention, ground lines 52 are variable in width, where the length is the extent of ground line 52 in the length direction over a substrate and the width is in a direction orthogonal to the length. The width variations can be spatially aligned so that, for example, one ground line 52 has its narrowest point where an adjacent ground line 52 has its widest point or so that one ground line 52 has its narrowest point where an adjacent ground line 52 has its narrowest point.

As used herein, micro-wires 55 in each ground line 52 are micro-wires 55 formed in a micro-wire layer that forms a conductive mesh of electrically connected micro-wires 55. If a substrate (e.g. display cover 48, display substrate 42, touch screen 30, or an additional substrate) on which micro-wires 55 are formed is planar, for example, a rigid planar substrate such as a glass substrate, the micro-wires 55 in a micro-wire layer are formed in, or on, a common plane as a conductive, electrically connected mesh. If the substrate on which micro-wires 55 is flexible and curved, for example a plastic substrate, the micro-wires 55 in a micro-wire layer are a conductive, electrically connected mesh that is a common distance from a surface of the flexible substrate.

In an example and non-limiting embodiment of the present invention, each micro-wire 55 is 5 microns wide and separated from neighboring micro-wires 55 in a ground line 52 by a distance of 50 microns, so that the ground line 52 is 90% transparent. As used herein, transparent refers to elements that transmit at least 50% of incident visible light, preferably 80% or at least 90%. The micro-wires 55 can be arranged in a micro-pattern that is unrelated to the pattern of the ground lines 52. Micro-patterns other than those illustrated in the Figures can be used in other embodiments and the present invention is not limited by the pattern of the micro-wires 55 or ground lines 52.

Coating methods for making protective layers are known in the art and can use, for example, spin or slot coating or extrusion of plastic materials on a substrate, or sputtering. Suitable materials are also well known. The formation of patterned electrical wires on a substrate are also known, as are methods of making displays, such as OLED or liquid crystal, on a substrate and providing and assembling covers with the substrate.

Micro-wires 55 can be metal, for example silver, gold, aluminum, nickel, tungsten, titanium, tin, or copper or various metal alloys including, for example silver, gold, aluminum, nickel, tungsten, titanium, tin, or copper. Other conductive metals or materials can be used. Micro-wires 55 can be made of a thin metal layer. Micro-wires 55 can be, but need not be, opaque. Alternatively, the micro-wires 55 can include cured or sintered metal particles such as nickel, tungsten, silver, gold, titanium, or tin or alloys including nickel, tungsten, silver, gold, titanium, or tin. Conductive inks can be used to form micro-wires 55 with pattern-wise deposition and curing steps. Other materials or methods for forming micro-wires 55 can be employed and are included in the present invention.

Micro-wires 55 can be formed by patterned deposition of conductive materials or of patterned precursor materials that are subsequently processed, if necessary, to form a conductive material. Suitable methods and materials are known in the art, for example inkjet deposition or screen printing with conductive inks. Alternatively, micro-wires 55 can be formed by providing a blanket deposition of a conductive or precursor material and patterning and curing, if necessary, the deposited material to form a micro-pattern of micro-wires 55. In another embodiment, micro-wires 55 can be formed by embossing trenches in a substrate (for example in an uncured or partially cured layer of resin and then curing the resin) and filling the trenches with a conductive material. The ground mesh 50 can be calendared to make the lines thinner thereby reducing the reflected light and improving off-axis optical performance.

Photo-lithographic and photographic methods are known to perform such processing. The present invention is not limited by the micro-wire materials or by methods of forming a pattern of micro-wires 55 on a supporting substrate surface. Commonly-assigned U.S. Ser. No. 13/406,649 filed Feb. 28, 2012, the disclosure of which is incorporated herein, discloses a variety of materials and methods for forming patterned micro-wires on a substrate surface.

In embodiments of the present invention, the micro-wires 55 are made by depositing an unpatterned layer of material and then differentially exposing the layer to form the different micro-wire micro-patterns. For example, a layer of curable precursor material is coated over the substrate and pattern-wise exposed. The first and second micro-patterns are exposed in a common step or in different steps. A variety of processing methods can be used, for example photo-lithographic or silver halide methods. The materials can be differentially pattern-wise exposed and then processed.

A variety of materials can be employed to form the patterned micro-wires 55, including resins that can be cured by cross-linking wave-length-sensitive polymeric binders and silver halide materials that are exposed to light. Processing can include both washing out residual uncured materials and curing or exposure steps.

In an embodiment, a precursor layer includes conductive ink, conductive particles, or metal ink. The exposed portions of the precursor layer can be cured to form the micro-wires 55 (for example by exposure to patterned laser light to cross-link a curable resin) and the uncured portions removed. Alternatively, unexposed portions of the first and second micro-wire layers can be cured to form the micro-wires 55 and the cured portions removed.

In another embodiment of the present invention, the precursor layers are silver salt layers. The silver salt can be any material that is capable of providing a latent image (that is, a germ or nucleus of metal in each exposed grain of metal salt) according to a desired pattern upon photo-exposure. The latent image can then be developed into a metal image. For example, the silver salt can be a photosensitive silver salt such as a silver halide or mixture of silver halides. The silver halide can be, for example, silver chloride, silver bromide, silver chlorobromide, or silver bromoiodide.

According to some embodiments, the useful silver salt is a silver halide (AgX) that is sensitized to any suitable wavelength of exposing radiation. Organic sensitizing dyes can be used to sensitize the silver salt to visible or IR radiation, but it can be advantageous to sensitize the silver salt in the UV portion of the electromagnetic spectrum without using sensitizing dyes.

Processing of AgX materials to form conductive traces typically involves at least developing exposed AgX and fixing (removing) unexposed AgX. Other steps can be employed to enhance conductivity, such as thermal treatments, electroless plating, physical development, and various conductivity-enhancing baths, as described in U.S. Pat. No. 3,223,525.

To achieve transparency, the total area occupied by the micro-wires 55 can be less than 15% of the ground lines 52.

In an embodiment, the first and second precursor material layers can each include a metallic particulate material or a metallic precursor material, and a photosensitive binder material.

In any of these cases, the precursor material is conductive after it is cured and any needed processing completed. Before patterning or before curing, the precursor material is not necessarily electrically conductive. As used herein, precursor material is material that is electrically conductive after any final processing is completed and the precursor material is not necessarily conductive at any other point in the micro-wire formation process.

Methods and devices for forming and providing substrates, coating substrates, patterning coated substrates, or pattern-wise depositing materials on a substrate are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are well known. These tools and methods can be usefully employed to design, implement, construct, and operate the present invention. Methods, tools, and devices for operating capacitive touch screens can be used with the present invention.

Although the present invention has been described with emphasis on capacitive touch screen embodiments, the ground mesh 50 of the present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

W1 ground line width
W2 ground line width
W3 ground line width
10 display apparatus
20 pixel
22 column inter-pixel gap 24 row inter-pixel gap
26 pixel group
30 touch screen
31 touch screen side
32 ground side
40 display
42 display substrate
43 pixel side
44 opposite side
48 display cover
50 ground mesh
52 ground line
53 electrically conductive layer
54 light-absorbing layer
55 micro-wire
57 projection
70 light
80 protective layer
90 controller
100 display and touch screen apparatus
110 display
120 touch screen
122 first transparent substrate
124 dielectric layer
126 second transparent substrate
128 first pad area
129 second pad area
130 first transparent electrode
132 second transparent electrode
134 wires
135 display ground
136 electrical buss connections
137 touch-screen ground
140 touch-screen controller
142 display controller
150 micro-wire
156 micro-pattern
200 provide display step
201 form pixels on display substrate step
205 locate ground mesh step
206 form ground mesh on ground substrate
207 form ground mesh on display substrate
210 laminate ground substrate to display substrate step
215 laminate touch screen over ground mesh step
220 provide display substrate step
230 form protective layer over pixels step
235 form ground mesh step
240 form protective layer over ground mesh step
250 locate touch screen over ground mesh step
255 form ground mesh on display cover step
260 adhere display cover to display substrate step
270 connect ground mesh to display ground step
275 connect ground mesh to touch-screen ground step

The invention claimed is:

1. A method of making display apparatus, comprising:
providing a display having an array of pixels;
locating a ground mesh in proximity to the display, the ground mesh including a plurality of electrically connected ground lines located between the pixels, so that electro-magnetic radiation emitted or received by the display is reduced.

2. The method of claim 1, further including forming the ground mesh on a ground substrate separate from the display and laminating the display to the ground substrate.

3. The method of claim 1, further including forming the display on a display substrate and forming the ground mesh on or over the display substrate.

4. The method of claim 1, further including forming the display on a display substrate having a pixel side on or over which the pixels are formed and an opposed side, and locating the ground mesh on the opposed side.

5. The method of claim 1, further including forming the display on a display substrate having a pixel side on or over which the pixels are formed, and locating the ground mesh on the pixel side.

6. The method of claim 5, further including forming a protective layer over the pixels and locating the ground mesh over the protective layer.

7. The method of claim 6, further including coating the protective layer over the pixels.

8. The method of claim 6, further including forming the ground mesh on the protective layer.

9. The method of claim 6, further including providing a ground protective layer on or over the ground mesh.

10. The method of claim 9, further including forming a touch screen on or over the ground protective layer.

11. The method of claim 1, further including providing a touch screen and locating the ground mesh between the touch screen and the display.

12. The method of claim 11, further including laminating the touch screen to the ground mesh.

13. The method of claim 11, further including forming the touch screen on a touch-screen substrate having a touch-screen side and a ground side and providing the ground mesh on the ground side.

14. The method of claim 13, further including laminating the touch-screen substrate to the display with the ground mesh between the touch screen and the display.

15. The method of claim 1, further including providing a display ground and electrically connecting the display ground to the ground mesh.

16. The method of claim 1, further including providing a touch-screen ground and electrically connecting the touch-screen ground to the ground mesh.

17. The method of claim 16, further including providing a display ground and electrically connecting the display ground to the ground mesh.

18. The method of claim 1, further including providing a display cover and forming the ground mesh on the display cover.

19. The method of claim 1, further including providing a display substrate and forming the ground mesh on the display substrate.

* * * * *